US006855950B2

(12) United States Patent
McCreery

(10) Patent No.: US 6,855,950 B2
(45) Date of Patent: Feb. 15, 2005

(54) METHOD FOR CONDUCTANCE SWITCHING IN MOLECULAR ELECTRONIC JUNCTIONS

(75) Inventor: Richard L. McCreery, Worthington, OH (US)

(73) Assignee: The Ohio State University, Columbus, OH (US)

( * ) Notice: Subject to any disclaimer, the term of this patent is extended or adjusted under 35 U.S.C. 154(b) by 62 days.

(21) Appl. No.: 10/376,865

(22) Filed: Feb. 28, 2003

(65) Prior Publication Data

US 2004/0007758 A1 Jan. 15, 2004

Related U.S. Application Data

(60) Provisional application No. 60/365,465, filed on Mar. 19, 2002, and provisional application No. 60/405,397, filed on Aug. 23, 2002.

(51) Int. Cl.[7] .............................................. H01L 35/24
(52) U.S. Cl. ....................................... 257/40; 257/103
(58) Field of Search ...................... 257/40, 103; 438/99

(56) References Cited

U.S. PATENT DOCUMENTS

| | | | |
|---|---|---|---|
| 4,584,235 A | 4/1986 | Roberts et al. | 428/333 |
| 4,828,917 A | 5/1989 | Wegner et al. | 428/333 |
| 5,520,968 A | 5/1996 | Wynne et al. | 428/1 |
| 5,846,909 A | 12/1998 | McDevitt et al. | 505/233 |
| 5,908,692 A | 6/1999 | Hamers et al. | 428/333 |
| 6,103,868 A | 8/2000 | Heath et al. | 528/482 |
| 6,128,214 A | 10/2000 | Kuekes et al. | 365/151 |
| 2002/0105897 A1 | 8/2002 | McCreery | |

OTHER PUBLICATIONS

Zhou, C. "Nanoscale metal/self–assembled monolayer/metal heterostructures" Appl Phys Lett 71 (5) Aug. 4, 1997, pp 611–13.*

C.A. Mirkin, M.A. Ratner, *"Molecular Electronics"*, Annu. Rev. Phys. Chem., 1992, 43, 719–754.

M.A. Reed, J.M. Tour, *"Computing with Molecules"*, Scientific American, 2000, 86–93.

L.A. Bumm, J.J. Arnold, M.T. Cygan, T.D. Dunbar, T.P. Burgin, L. Jones, D.L. Allara, J.M. Tour, P.S. Weiss, *"Are single Molecular Wires Conducting?"*, Science, 1996, 271, 1705.

C. Zhou, M.R. Deshpande, M.A. Reed, L. Jones, J.M. Tour, *"Nanoscale Metal/Self–Assembled Monolayer/Metal Heterostructures"* Appl. Phys. Lett., 1997, 71(5), 661.

M.A. Reed, C. Zhou, C.J. Muller, T.P. Burgin, J.M. Tour, *"Conductance of a Molecular Junction"*, Science, 1997, 278, 252.

L.A. Bumm, J.J. Arnold, T.D. Dunbar, D.L. Allara, P.S. Weiss, *"Electron Transfer through Organic Molecules"*, J. Phys. Chem. B., 1999, 103, 8122–8127.

(List continued on next page.)

*Primary Examiner*—Sara Crane
(74) *Attorney, Agent, or Firm*—Standley Law Group LLP

(57) ABSTRACT

The present invention includes a chemical monolayer construction that comprises: a substrate having a contact surface, and a monolayer of a plurality of substantially parallel molecular units attached to the contact surface of the substrate. The molecular units are strongly coupled electronically to the substrate. The contact surface of the substrate has a roughness value less than or equal to the average length of the molecular units. The molecular units comprise a chemical structure that is capable of being changed from a relatively non-conductive state to a relatively conductive state by the application of a stimulus. The present invention also includes electronic circuit components and devices including chemical monolayer constructions.

120 Claims, 13 Drawing Sheets

OTHER PUBLICATIONS

C.P. Collier, E.W. Wong, M. Belohradsky, F.M. Raymo, J.F. Stoddart, P.J. Kuekes, R.S. Williams, J.R. Heath, "Electronically Configurable Molecular–Based Logic Gates", Science, 1999, 285, 391–393.

C.P. Collier, G. Mattersteig, E.W. Wong, Y. Luo, K. Beverly, J. Sampaio, F.M. Raymo, J.F. Stoddart, J.R. Heath, "A[2] Catenane–Based Solid State Electronically Reconfigurable Switch", Science, 2000, 289, 1172–1175.

J. Pinson, J. Saveant, R. Hitmi, "Process for Modifying the Surface of Carbon–Containing Materials by Electro–Chemical Reduction of Diazonium Salts, Applicable in Particular to Carbon Fibers For Composite Materials: Carbon–Containing Materials So Modified", French Patent, PCT/FR92/0087, 1992.

P. Allongue, M. Delamar, B. Desbat, O. Fagebaume, R. Hitmi, J. Pinson, J.M. Saveant, "Covalent Modification of Carbon Surfaces by Aryl Radicals Generated from the Electrochemical Reduction of Diazonium Salts", J. Am. Chem. Soc., 1997, 119, 201–207.

Y–C. Liu, R.L. McCreery, "Reactions of Organic Monolayers on Carbon Surfaces Observed with Unenhanced Raman Spectroscopy", J. Am. Chem. Soc., 1995, 117, 11254.

S. Ranganathan, R. McCreery, S.M. Majji, M. Madou, "Photoresist–Derived Carbon for Microelectrochemical Applicaions", J. Electrochem. Soc., 2000. 117, 277–282.

S.N. Yaliraki, M. Kemp, M.A. Ratner, "Conductance of Molecular Wires: Influence of Molecule–Electrode Binding", J. Am. Chem. Soc., 1999, 121, 3428–3434.

T. Rueckes, K. Kim, E. Joselevich, G.Y. Tseng, C. Cheung, C.M. Lieber, "Carbon Nanotube–based Nonvolatile Random Access Memory of Molecular Compting", Science, 2000, 289,94–97.

J. Chen, M.A. Reed, A.M. Rawlett, J.M. Tour, "Large On–Off Ratios and Negative Differential Resistance in a Molecular Electronic Device", Science, 1999, 286, 1551–1552.

C. Kergueris, J.P. Bourgoin, S. Palacin, D. Esteve, C. Urbina, M. Magoga, C. Joachim, "Electron Transport Through a Metal–Molecule–Metal Junction", Phys. Review B, 1999, 59(19), 12505.

W. Tian, S. Datta, S. Hong, R. Reifenberger, J.I. Henderson, C.P. Kubiak, "Conductance Spectra of Molecular Wires". J. Chem. Physics, 1998, 109(7), 2874–2882.

D.F. Padowitz, R.J. Hamers, "Voltage–Dependent STM of Covalently Bound Molecules on Si (100)", J. Phys. Chem., 1998, 102, 8541–8545.

S. Datta, W. Tian, S. Hong, R. Reifenberger, J.I. Henderson, C.P. Kubiak, "Current–Voltage Characteristics of Self–Assembled Monolayers by Scanning Tunneling Microscopy", Phys. Rev. Let., 1997, 79(13), 2530–2533.

C.H. de Villeneuve, J. Pinson, M.C. Bernard, P. Allongue, "Electrochemical Formation of Close–packed Phenyl layers on Si (111)", J. Phys. Chem. B., 1997, 101, 2415–2420.

Y–C Liu, R.L. McCreery, "Raman Spectroscopic Determination of the Structure and Orientation of Organic Monolayers Chemisorbed on Carbon Electrode Surfaces", Anal. Chem., 1997, 69, 2091.

C. Joachim, J.K. Gimzewski, R.R. Schlittler, C. Chavy, "Electronic Transparence of a Single $C_{60}$ Molecule", Phys. Rev. Let., 74(11), 2102–2105.

P. Allongue, M. Delamar, B. Desbat, O. Fagebaume, R. Hitmi, J. Pinson, J.M. Saveant, "Covalent Modification of Carbon Surfaces by Aryl Radicals Generated from the Electrochemical Reduction of Diazonium Salts", J. Am. Chem. Soc., 1997, 119, 201–207.

C. P. Andrieux, F. Gonzales, J.M. Saveant, "Derivatization of Carbon Surfaces by Anodic Oxidation of Arylacetates, Electrochemical Manipulation of the Grafted Films", J. Am. Chem. Soc., 1997, 4292–4300.

Peihong Chen, R.L. McCreery, "Control of Electron Transfer Kinetics at Glassy Carbon Electrodes by Specific Surface Modifiaction", Anal. Chem., 1996, 68, 3958.

M.T. Cygan, T.D. Dunbar, J.J. Arnold, L.A. Bumm, N.F. Shedlock, T.P. Burgin, L. Jones, D.L. Allara, J.M. Tour, P.S. Weiss, "Insertion, Conductivity, and Structures of Conjugated Organic Oligomers in Self–Assembled Alkanethiol Monolayers of Au(111)", J. Am. Chem. Soc., 1998, 120, 2721–2732.

Y. Xia, N. Ventateswaran, D. Qin, J. Tein, G.M. Whitesides, "Use of Electroless Silver as the Substrate in Microcontact Printing of Alkanethiols and Its Application in Microfarication", Langmuir, 1998, 14, 363–371.

D.G. Walter, D.J. Campbell, C.A. Mirkin, "Photon–Gated Electron Transfer in Two–Component Self–Assembled Monolayers", J. Phys. Chem. B., 1999, 103, 402–405.

G.S. McCarty, P.S. Weiss, "Scanning Probe Studies of Single Nanostructures", Chem. Rev., 1999, 99, 1983–1990.

Y. Xia, J.A. Rogers, K.E. Paul, G.M. Whitesides, "Unconventional Methods for Fabricating and Patterning Nanostructures", Chem. Rev., 1999, 99, 1823–1848.

D.H. Gracias, J. Tien, T.L. Breen, C. Hsu, G.M. Whitesides, "Forming–Electrical Networks in Three Dimensions by Self–Assembly", Science, 2000, 289, 1170–1172.

D.I. Gittens, D. Bethell, R.J. Nichols, D.J. Schiffrin, "Diode– Like Electron Transfer Across Nanostructured Films Containing a Redox Ligand", J. Mater. Chem., 2000, 10, 79–83.

M.P. Schwartz, M.D. Ellison, S.K. Coulter, J.S. Hovis, R.J. Hamers, "Interaction of π–Bonded Semiconductor Surfaces: Structure, Selectivity, and Mechanistic Implications", J. Am. Chem. Soc., Web Edition 2000.

R.J. Hamers, S.K. Coulter, M.D. Ellison, J.S. Hovis, D.F. Padowitz, M.P. Schwartz, C.M. Greene, J.N. Russell, "Cycloaddition Chemistry of Organic Molecules with Semiconductor Surfaces", Acc. Chem. Res., 2000.

J.S. Hovis, S.K. Coulter, R.J. Hamers, M.P. D'Evelyn, J.N. Russell, J.E. Butler, "Cycloaddition Chemistry at Surfaces: Reaction of Alkenes with the Diamond (001)–2 x 1 Surface", J. Am. Chem. Soc., 2000, 122, 732–733.

J.J. Storhoff, A.A. Lazarides, R.C. Mucic, C.A. Mirkin, R.L. Letsinger, G.C. Schatz, "What Controls the Optical Properties of DNA–Linked Gold Nanoparticle Assemblies?", 2000, 122, 4640–4650.

M.D. Musick, C.D. Keating, L.A. Lyon, S.L. Botsko, D.J. Pena, W.D. Holliway, T.M. McEvoy, J.N. Richardson, M.J. Natan, "Metal Films Prepared by Stepwise Assembly. 2 Construction and Characterization of Colloidal Au and Ag Multilayers", Chem. Mater., WEB 2000.

M. A. Reed, C. Zhou, C. J. Muller, T. P. Burgin, and J. M. Tour, "Conductance of a Molecular Junction", Science, 278, Oct. 10, 1997.

J. Chen, M. A. Reed, A. M. Rawlett, and J. M. Tour, "Large On–Off Ratios and Negative Differential Resistance in a Molecular Electronic Device", Science, 286, Nov. 19, 1999.

Mark A. Reed and James M. Tour, "Computing with Molecules", *Scientific American*, 86 (2000).

Z. J. Donhauser, B. A. Mantooth, K. F. Kelly, L. A. Bumm, J. D. Monnell, J. J. Stapleton, D. W. Price, Jr., A. M. Rawlett, D. L. Allara, J. M. Tour, and P. S. Weiss, "Conductance Switching in Single Molecules Through Conformational Changes", *Science*, 292, 2303, Jun. 22, 2001.

C. P. Collier, E. W. Wong, M. Belohradsky, F. M. Raymo, J. F. Stoddart, P. J. Kuekes, R. S. Williams, and J. R. Heath, "Electronically Configurable Molecular–Based Logic Gates", *Science*, 285, 391, Jul. 16, 1999.

Charles P. Collier, Gunter Mattersteig, Eric W. Wong, Yi Luo, Kristen Beverly, José Sampaio, Francisco M. Raymo, J. Fraser Stoddart, and James R. Heath, "A [2]Catenane–Based Solid State Electronically Reconfigurable Switch", *Science*, 289, 1172, Aug. 18, 2000.

M. A. Reed, J. Chen, A. M. Rawlett, D. W. Price, and J. M. Tour, "Molecular Random Access Memory Cell", *App. Phys. Lett.*, 78, 3735, Jun. 4, 2001.

Srikanth Ranganathan, Ilson Steidel, Franklin Anariba, and Richard L. McCreery, "Covalently Bonded Organic Monolayers on a Carbon Substrate: A New Paradigm for Molecular Electronics", *Nano Letters*, 1, 491 (2001).

Chad A. Mirkin and Mark A. Ratner, "Molecular Electronics", *Annu. Rev. Phys. Chem.*, 43, 719 (1992).

J. Jortner and M. Ratner, *Molecular Electronics*, Blackwell Science Ltd., (1997).

Dorota T. Gryko, Junzhong Li, James R. Diers, Kristian M. Roth, David F. Bocian, Werner G. Kuhr, and Jonathan S. Lindsey, "Studies Related to the Design and Synthesis of a Molecular Octal Counter", *J. Mater. Chem.*, 11, 1162 (2001).

Arieh Aviram and Mark A. Ratner, Molecular Rectifiers, *Chem. Phys. Letters*, 29, 277, Nov. 15, 1974.

J. Chen, W. Wang, M. A. Reed, A. M. Rawlett, D. W. Price, and J. M. Tour, "Room–Temperature Negative Differential Resistance in Nanoscale Molecular Junctions", *App. Phys. Lett.*, 77, 1224 (2000).

James M. Tour, Masatoshi Kozaki, and Jorge M. Seminario, "Molecular Scale Electronics: A Synthetic/Computational Approach to Digital Computing", *J. Am. Chem. Soc.*, 120, 8486 (1998).

Srikanth Ranganathan, Richard L. McCreery, Sree M. Majji, and Marc Madou, "Photoresist–Derived Carbon for Microelectromechanical Systems and Electrochemical Applications", *J. Electrochem. Soc.*, 147, 277 (2000).

Srikanth Ranganathan and Richard L. McCreery, "Electroanalytical Performance of Carbon Films with Near–Atomic Flatness", *Anal. Chem.*, 73, 893 (2001).

Tzu–Chi Kuo, The Ohio State University, Columbus, Ohio (1999).

Yi–Chun Liu and R. L. McCreery, "Raman Spectroscopic Determination of the Structure and Orientation of Organic Monolayers Chemisorbed on Carbon Electrode Surfaces", *Anal. Chem.*, 69, 2091 (1997).

Yi–Chun Liu and Richard L. McCreery, "Reactions of Organic Monolayers of Carbon Surfaces Observed with Unenhanced Raman Spectroscopy", *J. Am. Chem. Soc.*, 117, 11254 (1995).

Ali Osman Solak, Srikanth Ranganathan, Takashi Itoh, Richrd L. McCreery, "A Mechanism for Conductance Switching in Carbon–Based Molecular Electronic Junctions", *Electrochemical and Solid State Letters* 5 (8) E43–E46 (2002).

J. L. Brédas, D. Beljonne, J. Cornil, J. Ph. Calbert, Z. Shuai, R. Slibey, "Electronic Structure of $\pi$–Conjugated Oligomers and Polymers: A Quantum–Chemical Approach to Transport Properties", *Synthetic Metals* 125 (2002) 107–116.

J. L. Brédas, "Relationship Between Band Gap and Bond Length Alternation in Organic Conjugated Polymers", *J. Chem. Phys.* 82 (8), Apr. 15, 1985.

Benoît Champagne, Eric A. Perpúte, "Bond Length Alternation Effects on the Static Electronic Polarizability and Second Hyperpolarizability of Polyacetylene Chains", *International Journal of Quantum Chemistry*, vol. 75, 441–447 (1999).

H. C. Akpati, P. Nordlander, L. Lou, Ph. Avouris, The Effects of an External Electric Field on the Adatom–Surface Bond: H and Al Adsorbed on Si (111), *Surface Science*, 372(1997) 9–20.

C. Henry de Villeneuve, J. Pinson, M. C. Bernard, and P. Allongue, Electrochemical Formation of Close–Packed Phenyl Layers on Si(111), *J.Phys. Chem B*, 1997, 101, 2415–2420.

Alain Adenier, Marie–Claude Bernard, Mohamed M. Chehimi, Eva Cabet–Deliry, Bernard Desbat, Olivier Fagebaume, Jean Pinson, and Fetah Podvorica, "Covalent Modification of Iron Surfaces by Electrochemical Reduction of Aryldiazonium Salts", *J. Am. Chem. Soc.* 2001, 123, 4541–4549.

Y. Karzazi, J. Cornil, and J. L. Brédas, Negative Differential Resistance Behavior in Conjugated Molecular Wires Incorporating Spacers: A Quantum–Chemical Description, *J. Am. Chem. Soc.* 2001, 123,10076–10084.

* cited by examiner

METHOD FOR CONDUCTANCE SWITCHING IN MOLECULAR ELECTRONIC JUNCTIONS

The present application claims priority to U.S. provisional application No. 60/365,465, filed Mar. 19, 2002 and to U.S. provisional application No. 60/405,397, filed Aug. 23, 2002, both of which are hereby incorporated in their entirety by reference.

The present invention was made with Government support under Grant No. RF 737159 awarded by the National Science Foundation. The United States Government may have certain rights to this invention under 35 U.S.C. §200 et seq.

TECHNICAL FIELD OF THE INVENTION

The present invention is in the field of chemical monolayers and microelectronic junctions, and includes chemical sensors, photosensors, electrochemical devices, memory devices, and other devices containing them.

BACKGROUND OF THE INVENTION

Conductance switching is the basis of many potential molecular electronic devices, and has been the focus of numerous research efforts in recent years. If a single molecule or an assembly of molecules can be switched between a high conductance state and a low conductance state by an electrical or optical stimulus, molecular scale memory and logic elements become possible, and molecular electronic components may be integrated with conventional microelectronics or be assembled into true molecular circuits. A range of molecular structures that exhibit conductance switching have been reported, including self-assembled monolayers (SAMs) of phenylethylnyl oligomers, rotaxanes oriented between two conductors by Langmuir-Blodgett assembly and nitroazobenzene thin films bonded to carbon. The phenomenon of negative differential resistance is notable as an example of a small collection of molecules changing from a high to a low resistance state in an applied electric field, then back to the high resistance state as the field was increased further. In several cases the states of the molecule are persistent and controllable, and may repeatedly cycle between "ON" (low resistance) and "OFF" (high resistance) states.

Although several examples of conductance switching have been extensively investigated, the switching mechanism in most cases is unknown, and the subject of some controversy. Negative differential resistance (NDR) was originally attributed to redox reactions involving a nitro and/or amino group in the monolayer molecule, but switching was subsequently observed without such groups present. NDR was also attributed to shifts in molecular orbital energies in response to an applied electric field, resulting in resonant tunneling at certain applied field magnitudes. Switching by isolated phenylethylnyl molecules in mostly aliphatic SAMs was observed to be stochastic by scanning tunneling microscopy (STM), and was attributed to confirmation changes, possibly involving interactions with the monolayer surrounding the active molecules. Of course, any mechanism established to explain conductance switching also bears directly on the broader issue of which factors control electronic conductivity in organic molecules, a topic of wide interest in the areas of conducting polymers, optoelectronic materials and energy conversion, in addition to molecular electronics.

We report here a completely new approach to fabricating molecular junctions that exhibit conductance switching, and which provide critical insights into the switching mechanism. The present application hereby incorporates, in its entirety, by reference application Ser. No. 09/755,437, filed Jan. 5, 2001, entitled "Chemical Monolayer and Micro-Electronic Junctions and Devices Containing Same".

"Conductance switching" refers to a change in conductivity of a molecular junction. The molecule acts as an electronic conductor that has at least two distinct states, one of low resistance and one of high resistance. In response to some stimulus, the molecule can be made to change conductance states. Switching has been reported for several molecular junctions, but never with carbon substrates. The mechanism is controversial and the chemical requirements for a successful molecular switch are unknown.

The large contemporary interest in molecular electronics has its origin in several diverse areas, including conducting polymers, long-range electron transfer, and molecular transistors. Combined with nanofabrication techniques, molecular electronics concepts hold great promise for creating new molecular devices for information storage and processing, as well as chemical and optical sensing. Two aspects of molecular electronics are particularly relevant to the current proposal: sublithographic fabrication and the exploitation of molecular properties in electronic devices. Much of the huge research effort in nanotechnology expended to date was directed toward nanoscale or single molecule devices, driven by the promise of much higher data density and processing speed. Such devices are below conventional lithographic size scales and would require novel methods of assembly. Single molecule or nanoscale electronic devices hold exceptional promise for technical and economic value, but also present formidable hurdles for practical utility, and massively parallel fabrication.

The approach described herein is directed toward the second major area of molecular electronics: the exploitation of molecular properties for electronic, chemical, and optical functions. A molecular junction of the present invention is nanoscale" (5–50 Å) in one dimension, but may be incorporated into a lithographic structure which is micron-scale in the other two dimensions. The use of a carbon substrate and conjugated, covalent bonding to a monolayer is a completely new approach to forming molecular junctions, and may have some profound consequences described below. Given the huge range of structures that might be incorporated into a molecular junction, a correspondingly large range of electronic properties is expected. As examples, molecules have a variety of energy levels analogous to semiconductor band gaps, and it should be possible to make a junction that can sense or produce photons, store charge, and interact with nearby molecules in a sensor.

In order to demonstrate the novelty of the present invention, a brief overview of the general area of molecular electronics is necessary. The general area has been quite active since approximately 1990, with a primary target being demonstration of current flow through molecules. Metal/thiol and Langmuir-Blodgett structures have demonstrated very interesting properties about molecules as components in electronic circuits, including Coulomb staircases, Schottky barriers, rectification, charge storage and staircase current/voltage curves. Molecular memory devices and multistate logic elements made from molecules assembled by the Langmuir-Blodgett technique have received wide recognition in both the scientific and popular press. Molecular junctions involving alkane chains between two mercury drops or between mercury and silver have also been examined, and compared to the behavior expected from tunneling. Although the gold/thiol and Langmuir-Blodgett structures used to fabricate these molecular devices have been widely studied, they have yet to yield a commercial electronic product.

A different approach related to the present invention is based on conducting organic polymers and semiconductors, which may be fabricated into analogs of traditional inorganic semiconductor devices such as transistors, light emitting diodes, and photosensors. The recent Nobel Prize in Chemistry, shared by Alan MacDiarmid, Alna Heeger, and Hideki Shirakawa recognized the promise of conducting polymers for electronic devices, and this technology is the basis of a start-up company (Uniax) recently purchased by DuPont. Although there is great promise for conducting polymers in electronic devices, light emitting diodes, and chemical sensors, the current approach differs fundamentally. The organic layer of the present invention is monomeric and oriented, unlike conducting polymers, and covalent bonding of contact and monolayer results in strong electronic coupling between contacts and molecules.

The field of electrochemistry is based on electron transfer between a conductor and a molecule, sometimes through a monolayer film, and some electrochemical principles are directly applicable to molecular electronics. The conceptual distinction between electrochemistry and molecular electronics is important, however, even though both may involve transduction between chemical and electronic events. Electrochemistry transforms a chemical event to electronic current flow by a process (such as a redox reaction) which has an activation barrier manifested as reorganization energy and other work terms. In contrast, the behavior of a molecule in an electronic circuit need not involve a chemical activation barrier or ionic motion; it may be viewed as totally electronic. Electrochemical signal transduction combines "chemical" and "electronic" phenomena, while signal transduction via molecular electronics may be entirely "electronic". The wide range of available molecular structures should impart equally wide variability to an electronic circuit, whether the circuit is totally "molecular" or a hybrid of molecular and conventional electronics. The potentially powerful aspects of molecular electronics to be exploited herein are the control and/or modulation of electronic circuit behavior by chemical events, and exploitation of molecular variety for advanced sensing and information processing.

This brief review indicates the promise of molecular electronics for various applications, including high data density storage, small and multifunctional processors, and possibly self-assembling complex devices. A few general observations about existing techniques are relevant to the approach proposed here. First, the Au/thiol SAM is widely studied and relatively simple to prepare, but is prone to pinholes generally limiting SAM devices to small areas (~30×20 nm). In fact, the SAM system must have a finite density of pinholes at equilibrium in order to exhibit self-assembly. Second, the relatively weak interactions responsible for orienting Au/thiol and Langmuir-Blodgett (LB) structures are thermodynamically prone to disordering, since the bond energies are 40 kcal/mole or less (about 1.6 eV). Third, both Au/thiol and LB structures result in an energy barrier between the conductor and the molecule. The polar, partly ionic Au—S bond represents an ~2 eV barrier for SAMs, while LB structures are often positioned on metal oxide films having high resistance (>1 MΩ). No structure yet reported has an ohmic contact between molecule and conductor, thus hindering the inclusion of molecular properties into an electronic circuit. Fourth, molecular devices with sizes below the current lithographic limit (~100 nm) are difficult to fabricate in a massively parallel device, at least with any currently available methods. So the problem of parallel fabrication must be surpassed for the case of sub-lithographic devices, in order to produce cost-effective components or integrated circuits. In summary, before a practical device that harnesses the power of directly combining molecular properties with electronic conduction can be realized, several milestones must be achieved:

Low resistance, ohmic contact between conducting contacts and molecule.

Incorporation of molecular properties (tunable band gap, chemical and optical sensitivity) into electronic circuit.

Robust, long-lived performance with indefinite shelf life.

Massively parallel fabrication, at or below the lithographic limit.

Compatibility with conventional microelectronics in a hybrid circuit.

SUMMARY OF THE INVENTION

The present invention includes chemical monolayer constructions, electronic constructions and devices containing one or more of those constructions.

As used herein, the term "stimulus" will be understood as including light, electrical stimuli, and chemical stimuli. Stimuli shall be understood as inducing switching in the junction (or monolayer) from a conductive state to a non-conductive state or vice versa.

As used herein, the term "strongly coupled electronically" is used to indicate that the substrate(s) and monolayer share one or more common molecular orbitals, and thus that electrons are delocalized over both the monolayer and the substrate. "Strongly coupled electronically" can also be interpreted as a chemical bond between the substrate and the monolayer which is stable enough to permit switching of the monolayer and the conductance of electricity across the bond. The term also refers, in the case of an organic moiety, to electronic coupling that is at a level greater than the aliphatic equivalent of the bond in question. A conjugated bond is one example of strong electronic coupling. As used throughout, the term "conjugated" shall mean conjugated in its typical and traditional capacity except for instances where a metal or silicon substrate are employed. For a metal or silicon substrate, the use of the term conjugated shall be interpreted to mean that the metal-carbon, metal-oxygen, silicon-carbon or silicon-oxygen bond between the substrate and the monolayer are strongly coupled electronically.

In broadest terms, the chemical monolayer construction of the present invention comprises: a substrate having a contact surface and a monolayer of a plurality of substantially parallel molecular units attached to the contact surface of the substrate, wherein the molecular units are attached to the substrate so as to be strongly coupled electronically to the substrate and wherein the molecular units have an average length, the contact surface of the substrate has a roughness value that is substantially less than or equal to the average length of the molecular units, and wherein the substantially parallel molecular units comprise a chemical structure that is capable of being changed from a relatively non-conductive state to a relatively conductive state by the application of a stimulus.

The contact substrate may be any substrate adapted to have a surface that may be produced or rendered to the specified smoothness by any appropriate method and that may be amenable to conjugated bonding. For example, the substrate may be conductive carbon, such as one comprising or consisting essentially of conductive carbon. Suitable conductive carbon substrates include pyrolyzed carbon, preferably in the form of pyrolyzed photoresist film (PPF). When carbon is used as the substrate, the electrical properties of the substrate may be varied by variance of the precursor (e.g., anthracene, polyacrylonitrile, etc.) or variance of the deposition technique (e.g., heat treatment or cold sputtering). This permits one to vary the electronic properties of the substrate as well as the monolayer. Further, the substrate may comprise a suitable metal or suitable semiconductor such as silicon.

The roughness parameter relates generally to the ability of the monolayer to electrically connect to the respective substrate surface(s)/conductive component(s) without a substantial number of areas or total area of conductance breakdown (referred to as "holes" or "shorts"). Naturally, depending on the degree of conductivity of the monolayer and its constituent molecular units, the monolayer junctions and devices may tolerate a greater or lesser number and/or size of shorts attendant to non-uniformity in the contact between the monolayer and the electrically contacted substrate or conductive components.

Accordingly, the present invention, in broadest terms, is not limited to any degree of roughness in the constituent substrate surfaces. However, for monolayers such as those described below, the root-mean-square (RMS) roughness typically will be less than about 200 Angstroms, most preferably less than about 5 Angstroms.

It is preferred that the substrate contact surface has a mean roughness value that is less than or equal to the average length of the molecular units coupled to the substrate. Preferably, the contact surface will have a mean roughness value less than 500 Angstroms, more preferably less than 50 Angstroms, and most preferably less than 10 Angstroms.

It is preferred that the monolayer of substantially parallel molecular units are chemically bonded to the contact surface of the substrate by a chemical bond having the formula: R—X, wherein R is a metal, silicon or carbon atom of the substrate and X is an oxygen or carbon atom of the substantially parallel molecular units. Thus, the substantially parallel molecular units may be bonded to the substrate by a chemical bond such as metal-oxygen, metal-carbon, carbon-carbon, carbon-oxygen, silicon-carbon or silicon-oxygen.

The molecular units may be any moiety capable of providing a conjugated bond to the first contact surface, and typically will contain at least three atoms. Typically, the size of the molecular unit will be at least as large as a benzene ring, and may have any degree of conjugation across its length, and may contain any number of heteroatoms in accordance with the desired conductivity or function (e.g., whether the desired device is to be tuned to a certain wavelength for photodetection or photodiode activity, or whether a metal-sensitive device is produced as described herein). The substantially parallel molecular units may comprise at least two types of molecular units having lengths that may or may not be substantially the same.

Preferably, the molecular units are of such dimension that holes or shorts in the chemical monolayer are not so substantial as to affect functionality. Preferably, the molecular units are substantially the same lengths. In this same regard, it is preferred that the contact surface of the substrate preferably has a roughness value that is smooth enough to avoid significant degradation in function of the monolayer. Preferably, the roughness value is substantially less than or equal to the maximum length of the molecular unit(s), or preferably, less than or equal to the average of the various lengths of the molecular unit types where more than one molecular unit type is used. One of the essential characteristics of the monolayer of the present invention is that an electric current may be made to pass substantially through the molecules. There may be small areas of "short circuit" in some instances, but the value of the invention stems from making the molecular unit(s) part of an electric circuit.

It is preferred that the chemical structure comprise at least one aromatic group when in the relatively non-conductive state, it is further preferred that the chemical structure be adapted to change to a quinoid moiety so as to attain a relatively conductive state. It is further preferred that the chemical structure be selected from the groups consisting of substituted and unsubstituted phenyl, benzyl and phenolic groups. It is more preferred that the chemical structure be selected from the group consisting of fluorene, biphenyl groups, nitrated biphenyl groups and azobenzyl groups. It is also preferred that the chemical structure comprises a sequence of phenylene oligomers, ranging from a single phenyl ring to polyphenylene.

The chemical monolayer construction may additionally comprise a source of electrical current supplied to the substrate so as to be conducted by the plurality of substantially parallel molecular units.

The present invention further comprises a chemical monolayer construction comprising a substrate having a contact surface and a monolayer of a plurality of substantially parallel molecular units attached to the contact surface of the substrate, wherein the molecular units are attached to the substrate through a conjugated bond, and wherein the substantially parallel molecular units comprise a chemical structure that is capable of being changed from a relatively non-conductive state to a relatively conductive state by the application of a stimulus.

The contact substrate may be any substrate adapted to have a surface that may be produced or rendered to the specified smoothness by any appropriate method and that may be amenable to conjugated bonding. For example, the substrate may be conductive carbon, such as one comprising or consisting essentially of conductive carbon. Suitable conductive carbon substrates include pyrolyzed carbon, preferably in the form of pyrolyzed photoresist film (PPF). When carbon is used as the substrate, the electrical properties of the substrate may be varied by variance of the precursor (e.g., anthracene, polyacrylonitrile, etc.) or variance of the deposition technique (e.g., heat treatment or cold sputtering). This permits one to vary the electronic properties of the substrate as well as the monolayer. Further, the substrate may comprise a suitable metal or a suitable semiconductor such as silicon.

It is preferred that the contact surface of the substrate has a roughness value (RMS) less than about 200 Angstroms. It is more preferred that the roughness value be less than about 20 Angstroms. It is most preferred that the roughness value be less than about 5 Angstroms. It is highly preferred that the contact surface has a roughness value that is substantially less than or equal to the average length of the molecular units.

The chemical structure may comprise at least one aromatic group when in the relatively non-conductive state, further, the chemical structure may be adapted to change to a quinoid moiety so as to attain the relatively conductive state. It is preferred that the chemical structure be selected from the groups consisting of substituted and unsubstituted phenyl, benzyl and phenolic groups. A more preferred chemical structure is polyphenylene. Further, the chemical structure may preferably be selected from the groups consisting of biphenyl groups, nitrated biphenyl groups and azobenzyl groups.

It is preferred that the monolayer of a plurality of substantially parallel molecular units are chemically bonded to the contact surface of the substrate by a chemical bond having the formula: R—X, where R is a metal or a carbon atom of the substrate and X is an oxygen or carbon atom of the substantially parallel molecular unit. It is further preferred that substantially parallel molecular units have an average length greater than or equal to the roughness value of the contact surface. It is also preferred that the substantially parallel molecular units are of substantially the same length. The substantially parallel molecular units may comprise at least two types of molecular units of different lengths.

The chemical monolayer construction may additionally comprise a source of electrical current supplied to the substrate so as to be conducted by the plurality of substantially parallel molecular units.

An electronic junction of the present invention comprises a first conductive component and a second conductive component. The first conductive component comprises a substrate having a contact surface and a monolayer of a plurality of substantially parallel molecular units having first and second ends, and attached through their first ends to the contact surface through a conjugated bond, and wherein the substantially parallel molecular units comprise a chemical structure that is capable of being changed from a relatively non-conductive state to a relatively conductive state by the application of a stimulus. The second conductive component is in electrical contact with the second ends of the substantially parallel molecular units.

It is preferred that the chemical structure comprise at least one aromatic group when in the relatively non-conductive state and that the chemical structure is adapted to change to a quinoid moiety so as to attain the relatively conductive state. It is preferred that the chemical structure is selected from the groups consisting of substituted and unsubstituted phenyl, benzyl, and phenolic groups. It is further preferred that the chemical structure is selected from the groups consisting of biphenyl groups, nitrated biphenyl groups and azobenzyl groups.

It is preferred that the first conductive component comprises electrically conductive carbon. It is further preferred that at least one of the first and second conductive components is translucent. It is additionally preferred that the second conductive component is chemically bound to the second ends of the substantially parallel molecular units.

It is preferred that the substantially parallel molecular units are chemically bonded to the contact surface of the substrate by a chemical bond having the formula: R—X, where R is a metal, silicon or carbon atom of the substrate and X is an oxygen or carbon atom of the substantially parallel molecular unit.

It is preferred that the substantially parallel molecular units are of substantially the same lengths. It is preferred that at least some of the molecular units comprise a moiety capable of binding at least one chemical species so as to alter the electronic character of at least some of the molecular units. It is further preferred that at least some of the molecular units comprise a moiety capable of binding a chemical entity selected from the group consisting of metal ions, organic molecules (such as neurotransmitters, pharmaceuticals, etc.), and biological materials (such as proteins, DNA fragments, etc.), so as to alter the electronic character of at least some of the molecular units. It is also preferred that at least some of the molecular units are sensitive to incident electromagnetic radiation which may alter the electronic character of at least some of the molecular units. It is additionally preferred that at least some of the molecular units form a molecular orbital such that the passage of current through at least some of the molecular units causes the emission of electromagnetic radiation from at least some of the molecular units. The electromagnetic radiation emitted may comprise visible light and/or infrared light. The electromagnetic radiation may be amplified as necessary.

Additionally, it is preferred that at least some of the molecular units are sensitive to the passage of current such that the passage of current through at least some of the molecular units causes a change in the reflectivity or transmissibility of the monolayer. That is to say, a change in reflectivity or transmissibility may result from switching in the monolayer. It is also preferred that at least some of the molecular units are sensitive to the incidence of electromagnetic radiation such that the incidence of electromagnetic radiation on at least some of the molecular units causes a change in the reflectivity or transmissibility of the monolayer. It is further preferred that at least some of the molecular units form an arrangement of molecular orbitals such that the electronic junction is capable of functioning as a semiconductor.

A second electronic junction of the present invention comprises: a first conductive component having a first contact surface; a monolayer of a first plurality of substantially parallel first molecular units having first and second ends, wherein each of the parallel first molecular units is of substantially the same length and is attached through its first end to the first contact surface through a conjugated bond; a second conductive component having first and second sides, wherein the first side is in electrical contact with the second ends of the parallel first molecular units and the second side having a second contact surface; a monolayer of a second plurality of substantially parallel second molecular units having first and second ends, each of the parallel second molecular units attached through their first end to the second contact surface through a conjugated bond; and a third conductive component having first and second sides, the first side being in electrical contact with the second ends of the parallel second molecular units; and wherein at least one of said first and second plurality of substantially parallel molecular units comprise a chemical structure that is capable of being changed from a relatively non-conductive state to a relatively conductive state by the application of a stimulus.

It is preferred that the first side of the second conductive component is covalently bound to the second ends of the parallel first molecular units. It is also preferred that the first side of the third conductive component is covalently bound to the second ends of the parallel second molecular units.

A memory device of the present invention comprises: a rigid support; a substrate disposed on the rigid support and having a contact surface; a monolayer of a plurality of substantially parallel molecular units having first and second ends, and attached through their first ends to the contact surface through a conjugated bond, and the second ends defining a scan surface, the molecular units adapted to be changed between a first memory state and a second memory state; and a read-write device adapted to move along the scan surface and adapted to stimulate a change of the molecular units between the first and second memory states, and to determine the memory state status of regions on the scan surface. Thus, the scan surface stores information by conductance switching in the molecular units. The quinoid structure provides the mechanism for storage.

The present invention further comprises a method of producing a chemical monolayer construction comprising the steps of: providing a substrate having a contact surface; and reacting chemical precursor bearing molecular units with the substrate so as to form a monolayer of a plurality of substantially parallel molecular units attached to the contact surface of said substrate, wherein the molecular units are attached to the substrate so as to be strongly coupled electronically to the substrate and wherein the molecular units have an average length, the contact surface of the substrate having a roughness value substantially less than or equal to said average length of the molecular units, and wherein the substantially parallel molecular units comprise a chemical structure that is capable of being changed from a relatively non-conductive state to a relatively conductive state by the application of a stimulus.

It is preferred that the molecular units become attached to the substrate through a conjugated bond. Further, it is preferred that the substrate comprises conductive carbon.

A second method of producing an electronic junction comprises the steps of: providing a first conductive component, the first conductive component comprising a substrate having a contact surface and a monolayer of a plurality of substantially parallel molecular units having first and second ends, and attached through their first ends to the contact surface through a conjugated bond, and wherein the substantially parallel molecular units comprise a chemical structure that is capable of being changed from a relatively non-conductive state to a relatively conductive state by the application of a stimulus; and placing a second conductive component in electrical contact with the second ends of the substantially parallel molecular units.

In a preferred method of the present invention, the second conductive component is chemically bound to the second ends of the substantially parallel molecular units. It is also preferred that the second conductive component is covalently bound to the second ends of the substantially parallel molecular units.

An electronic junction of the present invention comprises: a first conductive component, the first conductive component comprising a substrate having a contact surface and a monolayer of a plurality of substantially parallel molecular units having first and second ends, and attached through their first ends to the contact surface through a conjugated bond; and a second conductive component in electrical contact with the second ends of the substantially parallel molecular units, the second conductive component comprising a metal.

In a preferred electronic junction of the present invention, the first conductive component comprises electrically conductive carbon. It is also preferred that the second conductive component comprise a metal selected from the group consisting of mercury, silver, and copper. The metal comprised by the second conductive component may be deposited on the monolayer of substantially parallel molecular units by any available, suitable method including, but not limited to: chemical vapor deposition, thermal vapor deposition, sputtering, electrochemical deposition, and solution chemical reactions. It is further preferred that the second conductive component is chemically bound to the second ends of the substantially parallel molecular units. It is additionally preferred that at least one of the first and second conductive components is translucent.

Also in a preferred electronic junction of the present invention, the substantially parallel molecular units are of substantially the same lengths. It is further preferred that at least some of the molecular units comprise a moiety capable of binding at least one chemical species so as to alter the electronic character of at least some of the molecular units. It is preferred that at least some of the molecular units comprise a moiety capable of binding to a chemical entity selected from the group consisting of metal ions, organic molecules (such as neurotransmitters, pharmaceuticals, etc.), and biological materials (such as proteins, DNA fragments, etc.), so as to alter the electronic character of at least some of the molecular units. It is preferred that at least some of the molecular units are sensitive to incident electromagnetic radiation which may alter the electronic character of at least some of the molecular units. Further, it is preferred that at least some of the molecular units form a molecular orbital such that the passage of current through at least some of the molecular units causes the emission of electromagnetic radiation from at least some of the molecular units. The electromagnetic radiation emitted may comprise visible light and/or infrared light. The electromagnetic radiation may be amplified as necessary.

Additionally, it is preferred that at least some of the molecular units are sensitive to the passage of current such that the passage of current through at least some of the molecular units causes a change in the reflectivity or transmissibility of the monolayer. Again, changes in reflectivity or transmissibility may result from switching in the monolayer. Further, it is preferred that at least some of the molecular units are sensitive to the incidence of electromagnetic radiation such that the incidence of electromagnetic radiation on at least some of the molecular units causes a change in the reflectivity or transmissibility of the monolayer. Further still, it is preferred that at least some of the molecular units form an arrangement of molecular orbitals such that the electronic junction is capable of functioning as a semi-conductor.

The present invention also provides a method of producing an electronic junction comprising the steps of: providing a first conductive component, the first conductive component comprising (1) a substrate having a contact surface and (2) a monolayer of a plurality of substantially parallel molecular units having first and second ends, and attached through their first ends to the contact surface through a conjugated bond; and placing a second conductive component in electrical contact with the second ends of the substantially parallel molecular units, the second conductive component selected from the group consisting of mercury, silver and copper.

In a preferred method of the present invention, the second conductive component is chemically bound to the second ends of the substantially parallel molecular units. It is preferred that the second conductive component is covalently bound to the second ends of the substantially parallel molecular units. It is further preferred that the metal comprised by the second conductive component is deposited upon the monolayer of substantially parallel molecular units by one of the following methods: chemical vapor deposition, thermal vapor deposition, sputtering, electrochemical deposition, and solution chemical reactions.

In yet another electronic junction of the present invention, the electronic junction comprises: a first conductive component, the first conductive component comprising (1) a substrate having a contact surface, the substrate comprising a material selected from the group consisting of metals and semi-conductive metals (such as silicon) and (2) a monolayer of a plurality of substantially parallel molecular units having first and second ends, and attached through their first ends to the contact surface through a conjugated bond; and a second conductive component in electrical contact with the second ends of the substantially parallel molecular units, the second conductive component comprising a metal.

In a preferred electronic junction of the present invention, it is preferred that the substrate comprises a metal. It is more preferred that the metal is selected from group consisting of mercury, silver, and copper. Alternatively, the substrate may be constructed from a semi-conductive material such as indium-doped tin oxide or silicon.

It is preferred that at least one of the first and second conductive components is translucent. It is additionally preferred that the second conductive component is chemically bound to the second ends of the substantially parallel molecular units.

It is also preferred that the substantially parallel molecular units are of substantially the same lengths. It is preferred that at least some of the molecular units comprise a moiety capable of binding at least one chemical species so as to alter the electronic character of at least some of the molecular units. It is also preferred that at least some of the molecular units comprise a moiety capable of binding a chemical entity selected from the group consisting of metal ions, organic molecules (such as neurotransmitters, pharmaceuticals, etc.), and biological materials (such as proteins, DNA fragments, etc.), so as to alter the electronic character of at least some of the molecular units. It is further preferred that at least some of the molecular units are sensitive to incident electromagnetic radiation which may alter the electronic character of at least some of the molecular units. The electromagnetic radiation emitted may comprise visible light and/or infrared light. The electromagnetic radiation may be amplified as necessary.

Additionally, it is preferred that at least some of the molecular units are sensitive to the passage of current such that the passage of current through at least some of the molecular units causes a change in the reflectivity or transmissibility of the monolayer. That is to say, changes in reflectivity or transmissibility may result from switching. Further, it is preferred that at least some of the molecular units are sensitive to the incidence of electromagnetic radiation such that the incidence of electromagnetic radiation on at least some of the molecular units causes a change in the reflectivity or transmissibility of the monolayer. Further still, it is preferred that at least some of the molecular units form an arrangement of molecular orbitals such that the electronic junction is capable of functioning as a semi-conductor.

The present invention further provides a method of producing an electronic junction comprising the steps of: providing a first conductive component, the first conductive component comprising (1) a substrate having a contact surface, the substrate comprising a material selected from the group consisting of metals and semi-conductive materials and (2) a monolayer of a plurality of substantially parallel molecular units having first and second ends, and attached through their first ends to the contact surface through a chemical bond having the formula: R—X, wherein R is a metal, silicon, or carbon atom of the substrate and X is an oxygen or a carbon atom of the substantially parallel molecular units; and placing a second conductive component in electrical contact with the second ends of the substantially parallel molecular units.

In a preferred method of producing an electronic junction of the present invention, the substrate comprises a metal selected from the group consisting of mercury, silver, and copper. Alternatively, it is preferred that the substrate comprises a semi-conductive material comprising indium-doped tin oxide or silicon.

DETAILED DESCRIPTION OF THE PREFERRED EMBODIMENT(S)

In accordance with the forgoing summary, the following presents a detailed description of the preferred embodiment of the invention that is currently considered to be the best mode.

Our approach is much simpler than the alternatives. Specifically, a molecule in our junctions is induced to "switch" by molecular rearrangement in response to a high electric field. Molecules such as nitroazobenzene, nitrobiphenyl, terphenyl, and diethylaminophenyl are aromatic when bonded to a carbon (and/or metal or silicon) surface, and the rings are generally twisted with respect to each other and the carbon substrate. In a high static electric field, these molecules rearrange to a quinoid structure, in a process analogous to a redox reaction, but without counterions or solvent. The quinoid structure is more conjugated than the original molecule, as judged by changes in bond length and increased polarizability. Stronger electronic coupling or orbitals across the quinoid structure presumably leads to higher conductivity. Also accompanying formation of the quinoid species is a decrease in the band gap, which should increase conductivity. Analogous behavior is observed in polyacetylene and related conducting polymers, in which an injected electron causes changes in bond length that decreases the band gap and increases conductivity.

Figure 1:
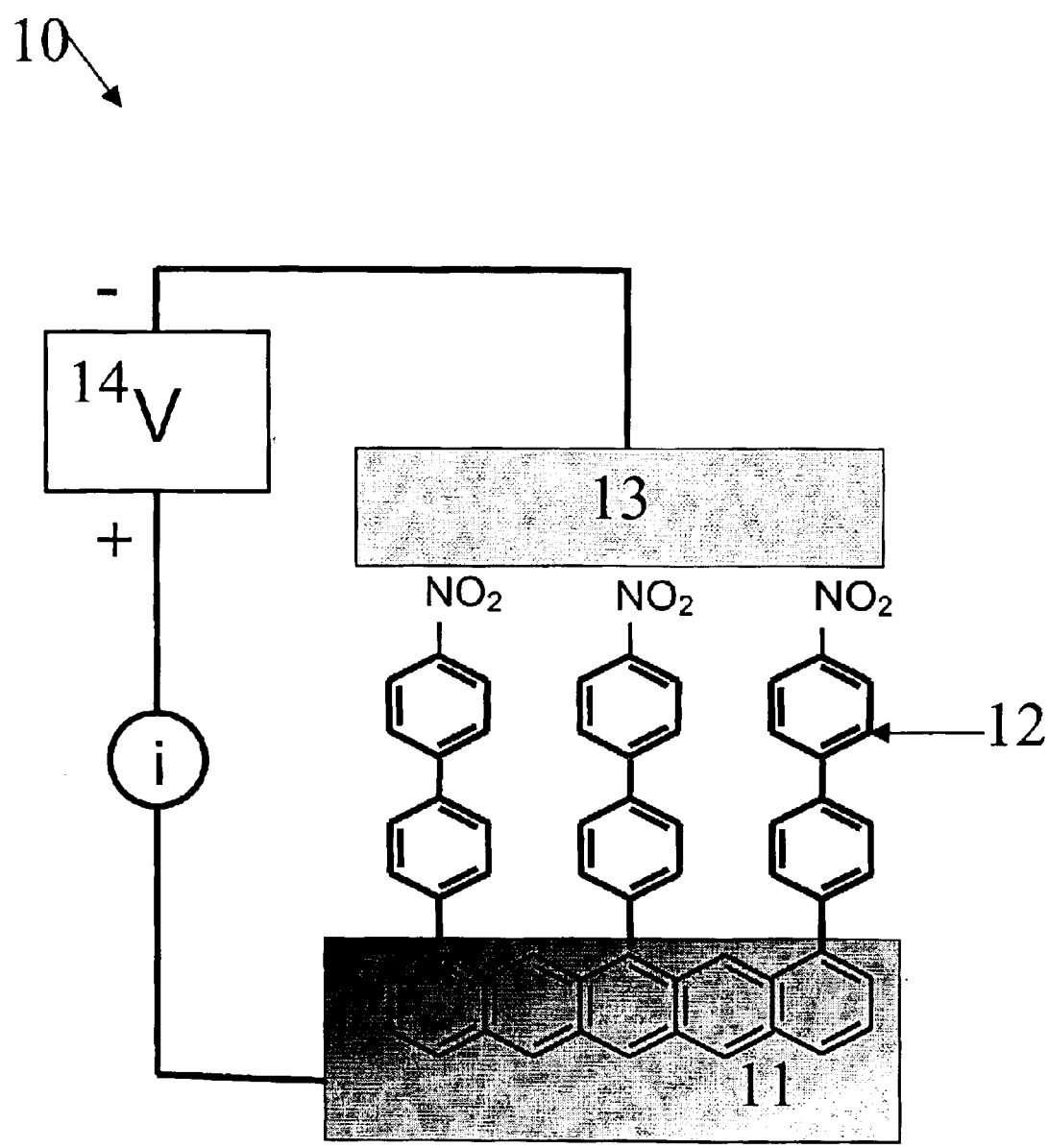
FIG. 1 shows a molecular junction of the present invention, for the case of a nitrobiphenyl monolayer.

Shown schematically in FIG. 1, the carbon-based molecular junction 10 consists of a covalently bonded monolayer 12 on a very flat (root-mean-square roughness <5 Å) graphitic carbon substrate 11 made by pyrolysis of a photoresist film (PPF). The second conductive component 13 is in electrical communication with the end of the monolayer 12 opposite the substrate 11. A source of potential 14 is in electrical communication with the substrate 11 and the second conductive component 13. The monolayer 12 is covalently bonded to the substrate by a carbon-carbon, metal-carbon, silicon-carbon, silicon-oxygen-carbon or metal-oxygen-carbon bond. Further, while it is preferred that the second conductive component 13 be a metal (such as mercury, copper, or silver) the second conductive component need not be a solid. Instead of a solid second conductive component, the second conductive component may be a solution (such as would be used in electrochemistry). If the molecular junction is in electrical communication with a solution instead of a second conductive component, the monolayer becomes a conductor and electron transfer from the substrate to the solution may occur to bring about oxidation or reduction of a species in solution In addition to nitrobiphenyl, many other molecules may be used to form the monolayer such as: para-terphenyl, 4'-nitrobiphenyl, biphenyl, 4-nitrophenyl, diethylaminophenyl, 4'-nitroazobenzene, 4-azobenzene, 2-anthraquinone, 2-anthracene, 2-chrysene, 4-stilbene, and 4-(phenylmethylene)phenyl, though this list is far from exhaustive. In fact any suitable molecule may be employed in the formation of the monolayer.

Figure 2:
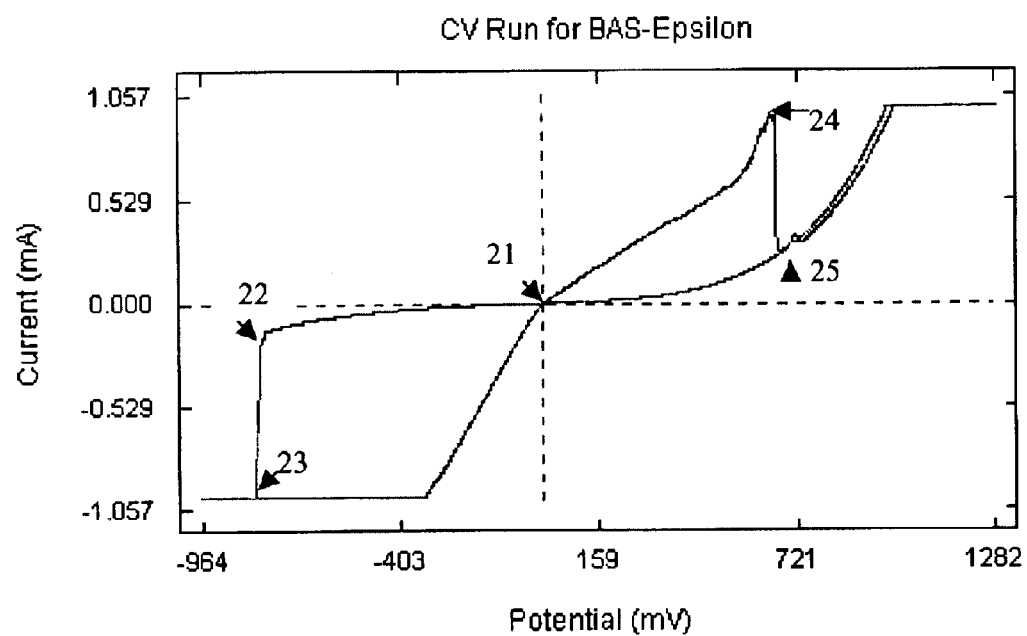
FIG. 2 is a current/voltage graph showing the conductance switching for a biphenyl junction

FIG. 2 is a current-voltage response graph for biphenyl. Initially 21, there was no potential on the biphenyl, however, the resistance of the biphenyl was high as the potential was swept towards approximately −825 mV. At approximately −825 mV 22, a dramatic decrease in the resistance of the biphenyl occurred as indicated by the increase in current 23. The biphenyl is said to have switched "on". This low resistance state persisted until the potential was swept towards approximately +650 mV 24. At approximately +650 mV, the resistance of the biphenyl increased, as indicated by the reduction in the current 25. The biphenyl had returned to its high resistance state. The biphenyl can be switched back to its low resistance state by switching it on again with a negative potential scan.

Figure 3:
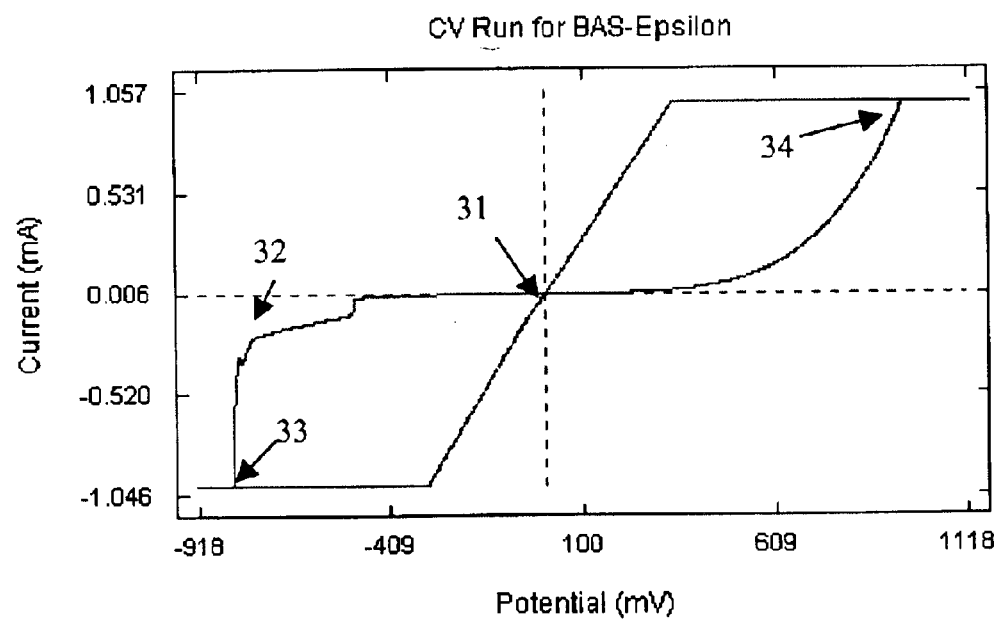
FIG. 3 is a current/voltage graph showing the conductance switching for a biphenyl junction.

FIG. 3 is a second current-voltage response curve for biphenyl. Again we note the dramatic increase in current 32, 33 accompanying the decrease in resistance as the potential is swept to the negative 31, 32. As expected, the resistance increases 34, 31, as shown by the reduction in current, as the potential is swept to the positive 33, 34.

Figure 4:
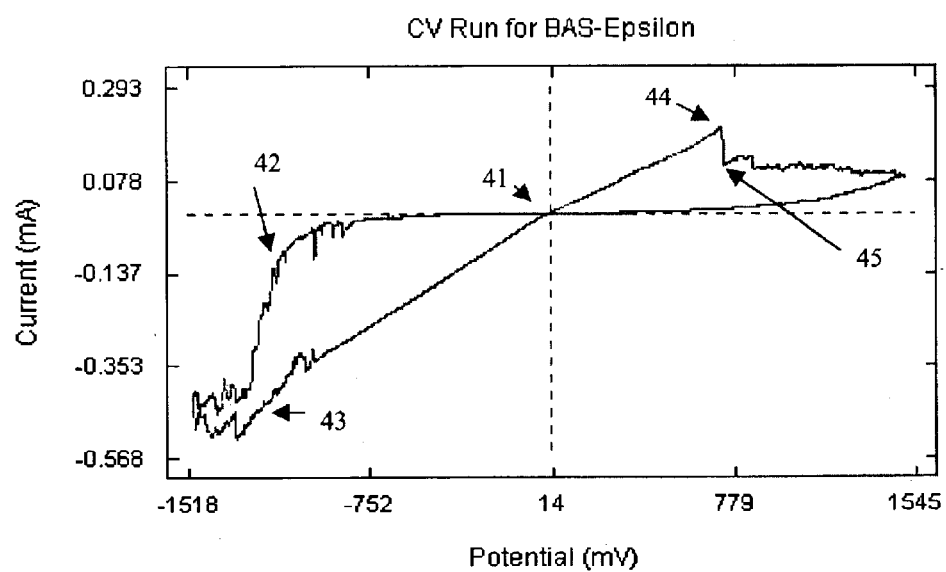
FIG. 4 is a current voltage graph showing the conductance switching for a nitrobiphenyl molecular junction.

FIG. 4 is a current-voltage response curve for a nitrobiphenyl molecular junction. The nitrobiphenyl junction comprised a pyrolyzed photoresist film as the substrate and mercury as the second conductive component. Initially 41, no voltage is applied to the junction. As the potential is scanned to approximately −1 V 42, a dramatic decrease in film resistance occurs, as indicated by the increase in current 43. This change is referred to as switching the junction "on". This low resistance state persists until the potential is swept positive to approximately +750 mV 44, where the junction switches "off", as indicated by the reduction of current flow 45. That is to say, the molecular junction has a high resistance in the region between 45 and 42 and a low resistance between 43 and 44. Thus, the nitrobiphenyl layer is acting as a bistable switch, which switches on for V<~−1000 mV and off for V>~+750 mV. This switching behavior may be repeated many times, but may be "frozen out" at low temperature (T<~−50° C.). A proposed mechanism responsible for this change in resistance is shown in FIG. 6.

Figure 5:
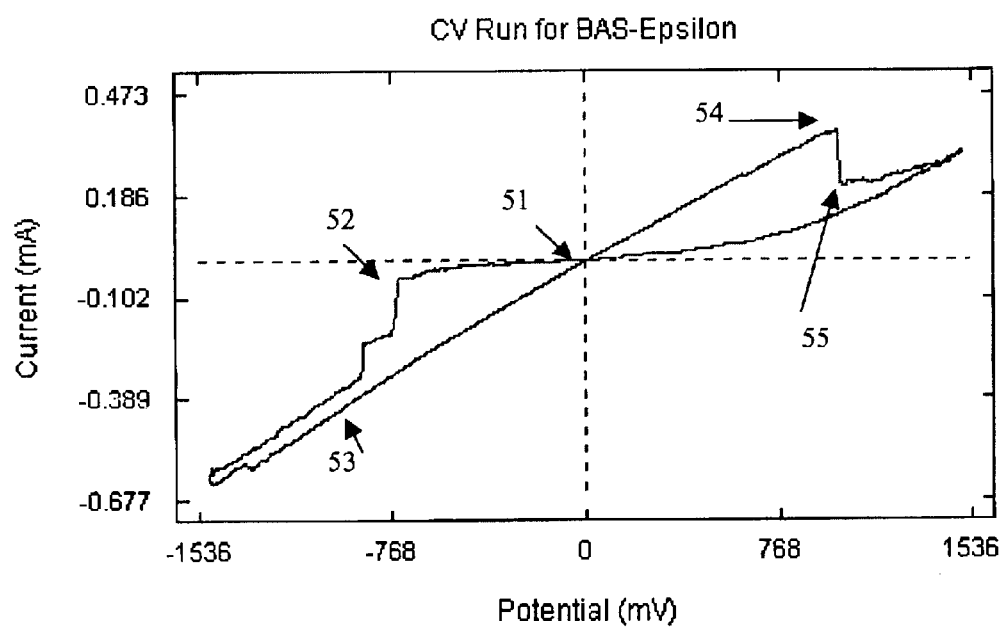
FIG. 5 is a current voltage graph showing the conductance switching for a nitrobiphenyl molecular junction.

FIG. 5 shows a second nitrobiphenyl molecular junction. Again, we note the high initial resistance of the nitrobiphenyl layer from 51 to 52. As the potential approaches approximately −800 mV, a sudden increase in current flow occurs 53 as the junction switches "on". Correspondingly, the resistance is dramatically lowered. The junction stays in this low resistance state until the potential is swept towards approximately +800 mV 54, where the junction switches off 55. The resistance then returns to a high state until the potential is again cycled.

Figure 6:
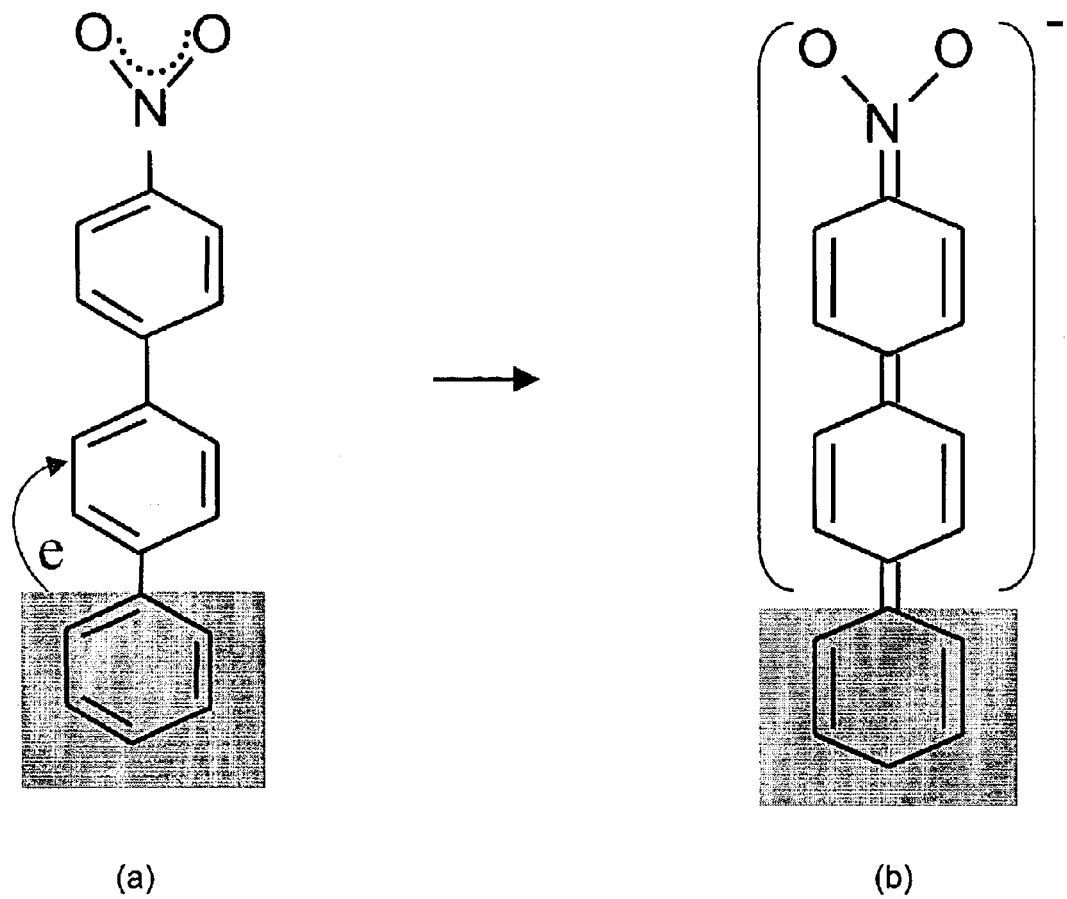
FIG. 6 illustrates the mechanism common to all switching molecules, illustrating the case of nitrobiphenyl. Structure (a) shows the injection of an electron into the nitrobiphenyl. Structure (b) is the "quinoid" form, which is one resonance form of several possible for the conductive state.
Figure 7:
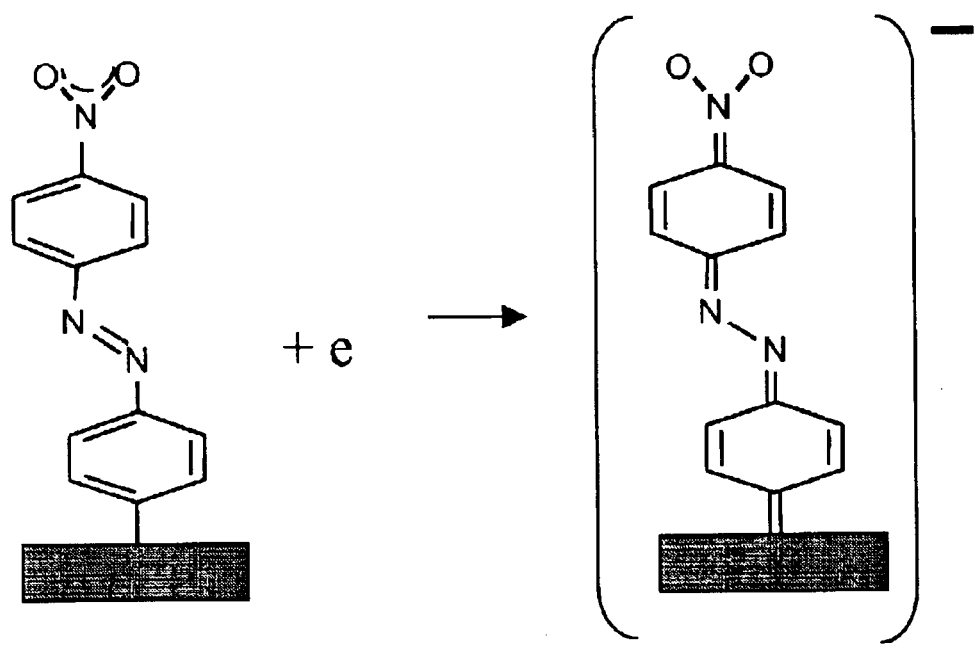
FIG. 7 shows the structural change that may accompany conductance switching in nitroazobenzene.
Figure 8:
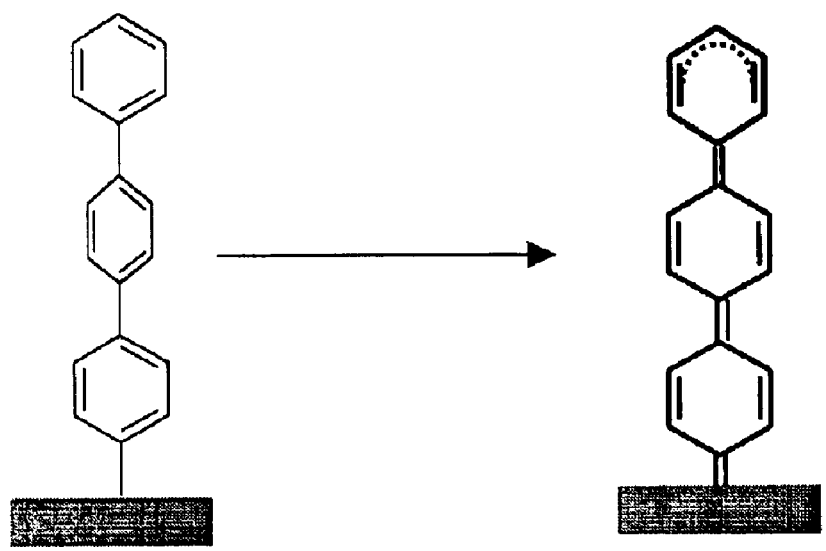
FIG. 8 shows the structural change that may accompany conductance switching in terphenyl.
Figure 9:
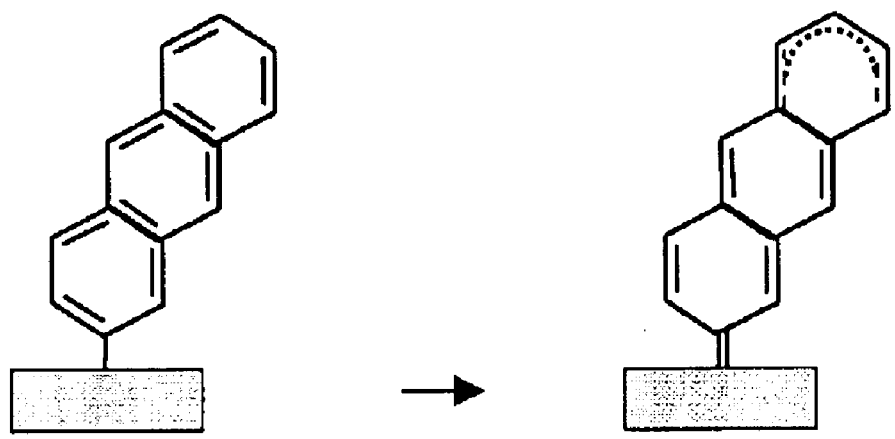
FIG. 9 shows the structural change that may accompany conductance switching in anthracene.
Figure 10:
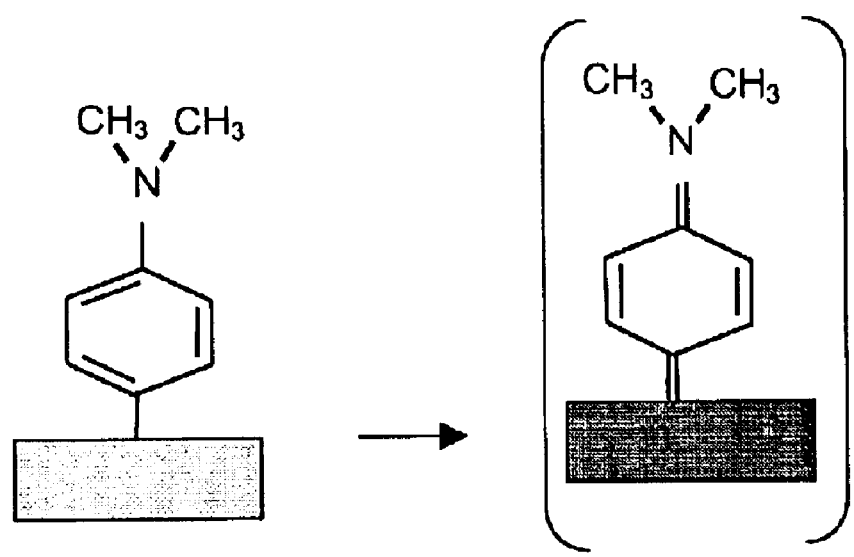
FIG. 10 shows the structural change that may accompany conductance switching in dimethylaminobenzene.

FIG. 6 illustrates the switching of a nitrobiphenyl molecule in a molecular junction of the present invention. As an electron is added to the nitrobiphenyl structure, a rearrangement occurs in the molecule causing the nitrobiphenyl to assume what we shall refer to as the "quinoid" form. The quinoid form includes several resonance forms in addition to that shown. It is important to note that the quinoid form is planar, and that the anion is delocalized over the entire structure. In fact, strong electronic coupling between the quinoid structure and the graphitic PI system may result in a large, delocalized electronic system that combines contributions from both the monolayer molecule and the carbon substrate. The ring rotation and bond length changes from the phenyl to quinoid forms result in activation barriers that are presumably the origin of the temperature dependence. The electron transfer is expected to be governed by Marcus theory, with the activation barrier representing the reorganization energy associated with ring rotation and nuclear rearrangement. FIG. 7 shows a possible mechanism for conductance switching in nitroazobenzene. FIG. 8 shows a possible mechanism for conductance switching in terphenyl. FIG. 9 shows a possible mechanism for conductance switching in anthracene. FIG. 10 shows a possible mechanism for conductance switching in dimethylaminobenzene monolayers. The invention is not limited to these structures, but they show that a structural change to produce a quinoid state of presumably higher conductivity is possible for a variety of structures.

Figure 11:
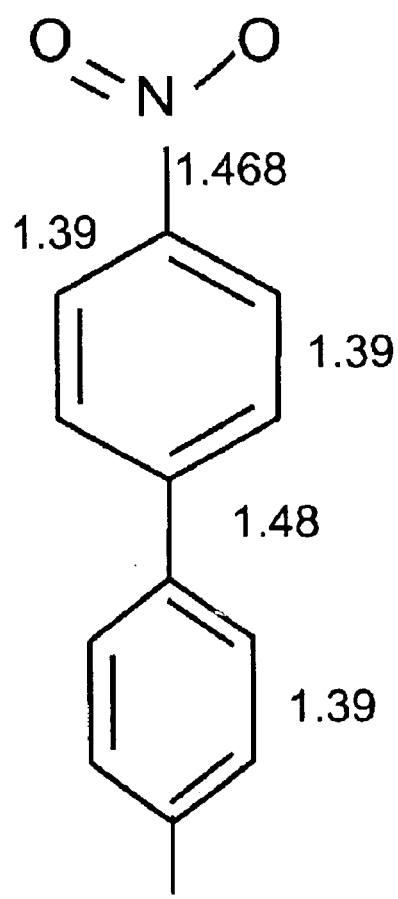
FIG. 11 is an illustration of the bond lengths for nitrobiphenyl, where $\Theta=38°$ ($\Theta$ is the dihedral angle between phenyl rings). In all cases where conductance switching is observed, it is possible that the more conductive state is a radical anion or a quinoid species, or other possible resonance forms.
Figure 12:
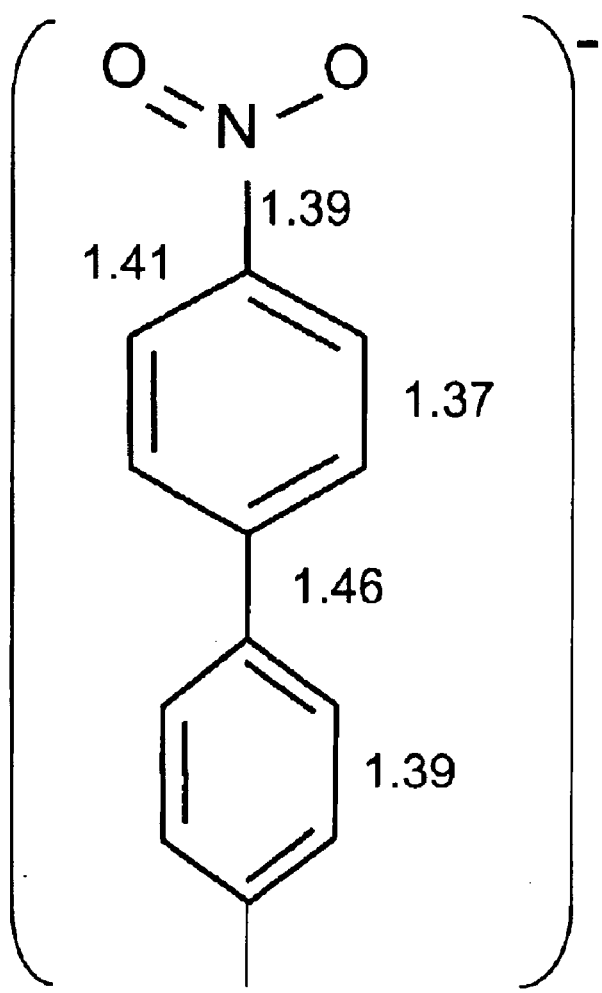
FIG. 12 is an illustration of the bond lengths for the nitrobiphenyl anion, where $\Theta=21°$. The anion is a possible alternative structure to the methide species shown in FIG. 13. The bond lengths in the anion reflect that it has some quinoid character.
Figure 13:
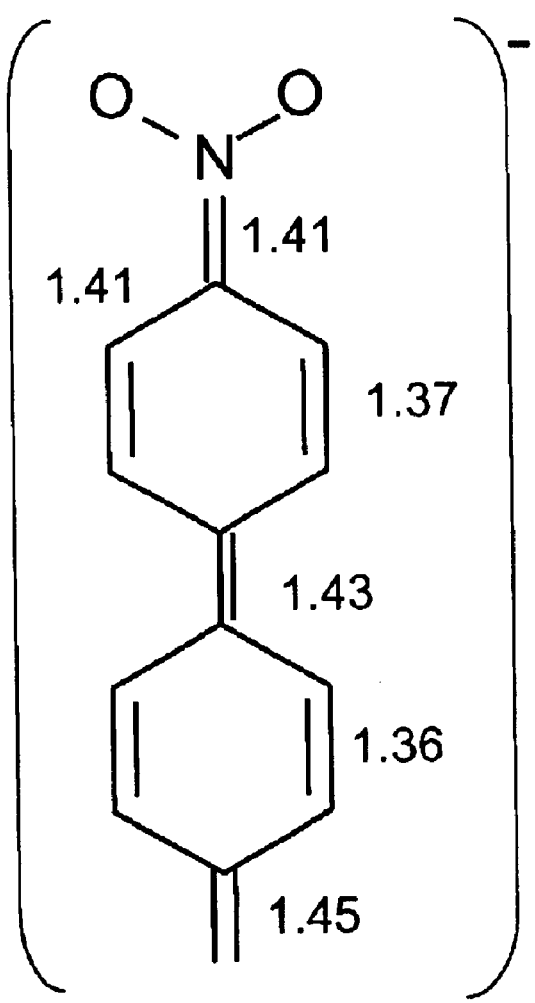
FIG. 13 is an illustration of the bond lengths for nitrobiphenyl methide, where $\Theta=1.1°$.

It is useful to consider the structural changes associated with electron transfer from PPF to a monolayer molecule in more detail. Rather than attempt to analyze graphite fragments theoretically, model structures based upon nitrobiphenyl and its quinoid form were used. 4-Nitrobiphenyl 4'-methide was used to force the nitrobiphenyl into quinoid form. Bond lengths and charges distributions were calculated with Gaussian 98 using density functional theory (B3LYP/6–31 G(d) level) for nitrobiphenyl anion, and nitrobiphenyl methide. The calculated structures and selected bond lengths are shown in FIGS. 11–13. The methide is planar, as opposed to a 38° dihedral angle in nitrobiphenyl. The bridging C—C bond shortens by 0.03 Å in the anion and 0.058 Å in the quinoid form. These observations support the changes in conjugation shown in FIGS. 6–13, with the nitrophenyl/PPF bond taking on double bond character and the two rings in nitrobiphenyl becoming coplanar with the graphite plane of the PPF.

FIG. 11 illustrates the chemical structure of nitrobiphenyl and its associated bond lengths. FIG. 12 illustrates the chemical structure of the nitrobiphenyl anion and its associated bond lengths. FIG. 13 illustrates the chemical structure of nitrobiphenyl methide and its associated bond lengths. Both the anion and the methide have significantly different bond lengths from the parent nitrobiphenyl molecule, and these changes are associated with the conductance increase. It should be noted that the anion and methide are quite similar, and may be different resonance forms of a single molecular entity.

The present invention may be used in the following industrial and commercial applications:

The existing microelectronics industry is based on semiconductors such as silicon and metal oxides, fabricated into a variety of junctions between semiconductors to make P—N junctions, diodes, transistors, etc. The monolayer junction disclosed herein may have quite different and more versatile properties than conventional semi-conductor junctions. Since the molecular orbitals of the monolayers can be varied by alterations in chemical structure, a wide variety of transfer functions are possible. PPF may be fabricated in complex patterns via photolithography, so it may be possible to combine monolayer junctions with conventional semi-conductor microcircuits. Possible new micro-devices based on monolayer junctions include capacitors, multistate storage elements, and optically, sensitive switches.

Further the monolayer may be made photosensitive, by choosing a molecule with a HOMO/LUMO gap corresponding to the desired photon energy. A thin metallic layer would be partially transparent, and photon arrival at the monolayer would trigger a conductivity increase, similar to a photodiode. Since the HOMO/LUMO gap is variable, the device could be wavelength specific. An array of such junctions could serve as an image collector, with color resolution possible. In addition, photodetectors might be combined with fiber optic and photonic circuits to yield a fast optical/electrical transducer.

The molecular orbitals of the monolayer may be sensitive to the chemical environment. For example, a bipyridyl spacer interacts with metal ions, and might yield a change in conductivity. A pattern of junctions would be required, since access to the monolayer is at its edge. Analysis of gases, liquids and solutions is amenable to this approach, with possible applications in clinical analysis, environmental monitoring, and process analytical chemistry.

By analogy to light emitting diodes, a potential across the proposed monolayer junction should inject electrons into a high-energy orbital of the monolayer. The electron may then make a transition to a lower energy orbital, emitting light. Arrays of such devices could be used in flat-panel displays or surface emitting diode arrays, with color controlled by the energy levels of the monolayer. Extension of light emission to amplification and lasing is conceivable.

For a thin metallic overcoat, the optical properties of the metal surface may depend on both the identities of the monolayer and the applied potential. The reflectivity vs. wavelength curve of the metal may be voltage dependent, and possibly modulatable on a rapid time scale. Color video projection and panel displays using natural or artificial white light are conceivable.

The preferred embodiments herein disclosed are not intended to be exhaustive or to unnecessarily limit the scope of the invention. The preferred embodiments were chosen and described in order to explain the principles of the present invention so that others skilled in the art may practice the invention. Having shown and described preferred embodiments of the present invention, it will be within the ability of one of ordinary skill in the art to make alterations or modifications to the present invention, such as through the substitution of equivalent materials or structural arrangements, or through the use of equivalent process steps, so as to be able to practice the present invention without departing from its spirit as reflected in the appended claim, the text and teaching of which are hereby incorporated by reference herein. It is the intention, therefore, to limit the invention only as indicated by the scope of the claims and equivalents thereof.

References

The following references are herein incorporated by reference:

1. M. A. Reed, C. Zhou, C. J. Miller, T. P. Burgin, and J. M. Tour, "Conductance of a Molecular Junction", *Science*, 278, 252 (1997).
2. J. Chen, M. A. Reed, A. M. Rawlett, and J. M. Tour, "Large On-Off Rations and Negative Differential Resistance in a Molecular Electronic Device", *Science*, 286, (1999).
3. M. A. Reed and J. M. Tour, "Computing with Molecules", *Scientific American*, 86 (2000).
4. Z. J. Donhauser, B. A. Mantooth, K. F. Kelly, L. A. Bumm, J. D. Monnell, J. J. Stapleton, D. W. Price, A. M. Rawlett, D. L. Allara, J. M. Tour, and P. S. Weiss, "Conductance Switching in Single Molecules Through Conformational Changes", *Science*, 292, 2303 (2001).
5. C. P. Collier, E. W. Wong, M. Belohradsky, F. M. Raymo, J. F. Stoddart, P. J. Kuekes, R. S. Williams, and J. R. Heath, "Electronically Configurable Molecular-Based Logic Gates", *Science*, 285, 391 (1999).
6. C. P. Collier, G. Mattersteig, E. W. Wong, Y. Luo, K. Beverly, J. Sampaio, F. M. Raymo, J. F. Stoddart, and J. R. Heath, "A [2]Catenane-Based Solid State Electronically Reconfigurable Switch", *Science*, 289, 1172 (2000).
7. M. A. Reed, J. Chen, A. M. Rawlett, D. W. Price, and J. M. Tour, "Molecular Random Access Memory Cell",*App. Phys. Lett.*, 78, 3735 (2001).
8. S. Ranganathan, I. Steidel, F. Anariba, and R. L. McCreery, "Covalently Bonded Organic Monolayers on a Carbon Substrate: A New Paradigm for Molecular Electronics", *Nano Letters*, 1, 491 (2001).
9. C. A. Mirkin and M. A. Ratner, "Molecular Electronics", *Annu. Rev. Phys. Chem.*, 43, 719 (1992).
10. J. Jortner and M. Ratner, *Molecular Electronics*, Blackwell Science Ltd., (1997).
11. D. T. Gryko, L. Junzhong, J. R. Diers, K. M. Roth, D. F. Bocian, W. G. Kuhr, and J. S. Lindsey, "Studies Related to the Design and Synthesis of a Molecular Octal Counter", *J. Mater. Chem.*, 11, 1162 (2001).
12. A. Aviram and M. Ratne, Molecular Rectifiers, *Chem. Phys. Letters*, 29, 277 (1974).
13. J. Chen, W. Wang, M. A. Reed, A. M. Rawlett, D. W. Price, and J. M. Tour, "RoomTemperature Negative Differential Resistance in Nanoscale Molecular Junctions", *App. Phys. Lett.*, 77, 1224 (2000).
14. J. M. Tour, M. Kozaki, and J. M. Seminario, "Molecular Scale Electronics: A Synthetic/Computational Approach to Digital Computing", *J. Am. Chem. Soc.*, 120, 8486 (1998).
15. S. Ranganathan, R. L. McCreery, S. M. Majji, and M. Madou, "Photoresist-Derived Carbon for Microelectrochemical Applications", *J. Electrochem. Soc.*, 147, 277 (2000).
16. S. Ranganathan and R. L. McCreery, "Electroanalytical Performance of Carbon Films with Near-Atomic Flatness", *Anal. Chem.*, 73, 893 (2001).
17. T. C. Kuo, The Ohio State University, Columbus, Ohio (1999).

18. Y. C. Liu and R. L. McCreery, "Raman Spectroscopic Determination of the Structure and Orientation of Organic Monolayers Chemisorbed on Carbon Electrode Surfaces", *Anal. Chem.*, 69, 2091 (1997).
19. Y. C. Liu and R. L. McCreery, "Reactions of Organic Monolayers of Carbon Surfaces Observed with Unenhanced Raman Spectroscopy", *J. Am. Chem. Soc.*, 117, 11254 (1995).
20. A. O. Solak, S. Ranganathan, T. Itoh, R. L. McCreery, "A Mechanism for Conductance Switching in Carbon-based Molecular Electronic Junctions", *Science*, not yet published as of date of application submission.

What is claimed is:

1. A chemical monolayer construction, said construction comprising:
   a substrate having a contact surface; and
   a monolayer of a plurality of substantially parallel molecular units attached to said contact surface of said substrate, wherein said molecular units are attached to said substrate so as to be strongly coupled electronically to said substrate and wherein said molecular units have an average length, said contact surface of said substrate has a roughness value that is substantially less than or equal to said average length of said molecular units, and wherein said substantially parallel molecular units comprise a chemical structure that is capable of being changed from a relatively non-conductive state to a relatively conductive state by the application of a stimulus.

2. A chemical monolayer construction according to claim 1 wherein said chemical structure comprises at least one aromatic group when in said relatively non-conductive state, said chemical structure adapted to be changed to a quinoid moiety so as to attain said a relatively conductive state.

3. A chemical monolayer construction according to claim 2 wherein said chemical structure is selected from the groups consisting of substituted and unsubstituted phenyl, benzyl and phenolic groups.

4. A chemical monolayer construction according to claim 2 wherein said chemical structure comprises a sequence of phenylene oligomers.

5. A chemical monolayer construction according to claim 3 wherein said chemical structure is selected from the group consisting of fluorene, biphenyl groups, nitrated biphenyl groups and azobenzyl groups.

6. A chemical monolayer construction according to claim 1 wherein said substantially parallel molecular units are chemically bonded to said contact surface of said substrate by a chemical bond having the formula:

wherein R is a metal, silicon, or a carbon atom of said substrate and X is an oxygen or carbon atom of said substantially parallel molecular unit.

7. A chemical monolayer construction according to claim 1 wherein said substantially parallel molecular units are of substantially the same lengths.

8. A chemical monolayer construction according to claim 1 wherein said substantially parallel molecular units comprise at least two types of molecular units that are of different lengths.

9. A chemical monolayer construction according to claim 1 wherein said substrate comprises electrically conductive carbon.

10. A chemical monolayer construction according to claim 1 wherein said substrate consists essentially of carbon selected from the group consisting of: electrically conductive carbon and pyrolyzed conductive carbon.

11. A chemical monolayer construction according to claim 1 additionally comprising a source of electrical current supplied to said substrate so as to be conducted by said plurality of substantially parallel molecular units.

12. A chemical monolayer construction according to claim 1 wherein said roughness value is less than 200 Angstroms.

13. A chemical monolayer construction according to claim 1 wherein said roughness value is less than 20 Angstroms.

14. A chemical monolayer construction according to claim 1 wherein said roughness value is less than 5 Angstroms.

15. A chemical monolayer construction according to claim 1 wherein said stimulus is selected from the group consisting of light, electrical stimuli, and chemical stimuli.

16. A chemical monolayer construction, said construction comprising:
    a substrate having a contact surface; and
    a monolayer of a plurality of substantially parallel molecular units attached to said contact surface of said substrate, wherein said molecular units are attached to said substrate through a conjugated bond, and wherein said substantially parallel molecular units comprise a chemical structure that is capable of being changed from a relatively non-conductive state to a relatively conductive state by the application of a stimulus.

17. A chemical monolayer construction according to claim 16 wherein said chemical structure comprises at least one aromatic group when in said relatively non-conductive state, said chemical structure adapted to be changed to a quinoid moiety so as to attain said a relatively conductive state.

18. A chemical monolayer construction according to claim 17 wherein said chemical structure is selected from the groups consisting of substituted and unsubstituted phenyl, benzyl and phenolic groups.

19. A chemical monolayer construction according to claim 17 wherein said chemical structure is a sequence of phenylene oligomers.

20. A chemical monolayer construction according to claim 17 wherein said chemical structure is selected from the group consisting of fluorene, biphenyl groups, nitrated biphenyl groups and azobenzyl groups.

21. A chemical monolayer construction according to claim 16 wherein said substantially parallel molecular units are chemically bonded to said contact surface of said substrate by a chemical bond having the formula:

wherein R is a metal, silicon or carbon atom of said substrate and X is an oxygen or carbon atom of said substantially parallel molecular unit.

22. A chemical monolayer construction according to claim 16 wherein said substrate comprises conductive carbon.

23. A chemical monolayer construction according to claim 16 wherein said substrate consists essentially of carbon selected from the group consisting of:
    conductive carbon and pyrolyzed conductive carbon.

24. A chemical monolayer construction according to claim 16 wherein said molecular units have an average length, said contact surface of said substrate has a roughness value that is substantially less than or equal to said average length of said molecular units.

25. A chemical monolayer construction according to claim 16 wherein said substantially parallel molecular units that are of substantially the same length.

26. A chemical monolayer construction according to claim 16 wherein said substantially parallel molecular units comprise at least two types of molecular units of different lengths.

27. A chemical monolayer construction according to claim 16 wherein said contact surface has a roughness value is less than 200 Angstroms.

28. A chemical monolayer construction according to claim 16 wherein said contact surface has a roughness value is less than 20 Angstroms.

29. A chemical monolayer construction according to claim 16 wherein said contact surface has a roughness value is less than 5 Angstroms.

30. A chemical monolayer construction according to claim 16 additionally comprising a source of electrical current supplied to said substrate so as to be conducted by said plurality of substantially parallel molecular units.

31. A chemical monolayer construction according to claim 16 wherein said stimulus is selected from the group consisting of light, electrical stimuli, and chemical stimuli.

32. An electronic junction comprising:
a first conductive component, said first conductive component comprising:
a substrate having a contact surface; and
a monolayer of a plurality of substantially parallel molecular units having first and second ends, and attached through their first ends to said contact surface through a conjugated bond, and wherein said substantially parallel molecular units comprise a chemical structure that is capable of being changed from a relatively non-conductive state to a relatively conductive state by the application of a stimulus; and
a second conductive component in electrical contact with said second ends of said substantially parallel molecular units.

33. An electronic junction according to claim 32 wherein said chemical structure comprises at least one aromatic group when in said relatively non-conductive state, said chemical structure adapted to be changed to a quinoid moiety so as to attain said a relatively conductive state.

34. An electronic junction according to claim 33 wherein said chemical structure is selected from the groups consisting of substituted and unsubstituted phenyl, benzyl and phenolic groups.

35. An electronic junction according to claim 33 wherein said chemical structure is selected from the group consisting of fluorene, biphenyl groups, nitrated biphenyl groups and azobenzyl groups.

36. An electronic junction according to claim 33 wherein said substantially parallel molecular units are chemically bonded to said contact surface of said substrate by a chemical band having the formula:

wherein R is a metal, silicon or carbon atom of said substrate and X is an oxygen or carbon atom of said substantially parallel molecular unit.

37. An electronic junction according to claim 32 wherein said first conductive component comprises electrically conductive carbon.

38. An electronic junction according to claim 32 wherein said substantially parallel molecular units are of substantially the same lengths.

39. An electronic junction according to claim 32 wherein second conductive component is chemically bound to said second ends of said substantially parallel molecular units.

40. An electronic junction according to claim 32 wherein at least some of said molecular units comprise a moiety capable of binding at least one chemical species so as to alter the electronic character of said at least some of said molecular units.

41. An electronic junction according to claim 32 wherein at least some of said molecular units comprise a moiety capable of binding a chemical entity selected from the group consisting of metal ions, organic molecules, and biological materials, so as to alter the electronic character of said at least some of said molecular units.

42. An electronic junction according to claim 32 wherein at least some of said molecular units are sensitive to incident electromagnetic radiation which may alter the electronic character of said at least some of said molecular units.

43. An electronic junction according to claim 42 wherein at least one of said first and second conductive components is translucent.

44. An electronic junction according to claim 32 wherein at least some of said molecular units form a molecular orbital such that the passage of current through at least some of said molecular units causes the emission of electromagnetic radiation from said at least some of said molecular units.

45. An electronic junction according to claim 32 wherein said electromagnetic radiation is visible light.

46. An electronic junction according to claim 32 wherein said electromagnetic radiation is infrared light.

47. An electronic junction according to claim 32 wherein said electromagnetic radiation is amplified.

48. An electronic junction according to claim 32 wherein at least one of said first and second conductive components is translucent.

49. An electronic junction according to claim 32 wherein at least some of said molecular units are sensitive to the passage of current such that the passage of current through at least some of said molecular units causes a change in the reflectivity or transmissibility of said monolayer.

50. An electronic junction according to claim 32 wherein at least some of said molecular units are sensitive to the incidence of electromagnetic radiation such that the incidence of electromagnetic radiation on at least some of said molecular units causes a change in the reflectivity or transmissibility of said monolayer.

51. An electronic junction according to claim 32 wherein at least some of said molecular units form an arrangement of molecular orbitals such that said electronic junction is capable of functioning as a semiconductor.

52. An electronic junction comprising:
(a) a first conductive component, said first conductive component comprising a first contact surface;
(b) a monolayer of a first plurality of substantially parallel first molecular units having first and second ends, each of said parallel first molecular units of substantially the same length and attached through its first end to said first contact surface through a conjugated bond;
(c) a second conductive component having first and second sides, said first side in electrical contact with said second ends of said parallel first molecular units, and said second side having a second contact surface;
(d) a monolayer of a second plurality of substantially parallel second molecular units having first and second ends, each of said parallel second molecular units attached through their first end to said second contact surface through a conjugated bond; and (e) a third conductive component having first and second sides, said first side in electrical contact with said second ends of said parallel second molecular units; and wherein at least one of said first and second plurality of substantially parallel molecular units comprise a chemical structure that is capable of being changed from a relatively non-conductive state to a relatively conductive state by the application of a stimulus.

53. An electronic junction according to claim 52 wherein said first side of said second conductive component is covalently bound to said second ends of said parallel first molecular units.

54. An electronic junction according to claim 52 wherein said first side of said third conductive component is covalently bound to said second ends of said parallel second molecular units.

55. A memory device, said memory device comprising:
a rigid support;
a substrate disposed on said rigid support and having a contact surface;
a monolayer of a plurality of substantially parallel molecular units having first and second ends, and attached through their first ends to said contact surface through a conjugated bond, and said second ends defining a scan surface, said molecular units adapted to be changed between a first memory state and a second memory state; and
a read-write device adapted to move along said scan surface and adapted to stimulate a change of said molecular units between said first and second memory states, and to determine the memory state status of regions on said scan surface.

56. A method of producing a chemical monolayer construction, said method comprising:
(a) providing a substrate having a contact surface; and
(b) reacting chemical precursor bearing molecular units with said substrate so as to form a monolayer of a plurality of substantially parallel molecular units attached to said contact surface of said substrate, wherein said molecular units are attached to said substrate so as to be strongly coupled electronically to said substrate and wherein said molecular units have an average length, said contact surface of said substrate has a roughness value substantially less than or equal to said average length of said molecular units, and wherein said substantially parallel molecular units comprise a chemical structure that is capable of being changed from a relatively non-conductive state to a relatively conductive state by the application of a stimulus.

57. A method of producing a chemical monolayer construction according to claim 56 wherein said molecular units become attached to said substrate through a conjugated bond.

58. A method of producing a chemical monolayer construction according to claim 56 wherein said substrate comprises conductive carbon.

59. A method of producing an electronic junction, said method comprising:
(a) providing a first conductive component, said first conductive component comprising:
(i) a substrate having a contact surface; and
(ii) a monolayer of plurality of substantially parallel molecular units having first and second ends, and attached through their first ends to said contact surface through a conjugated bond, and wherein said substantially parallel molecular units comprise a chemical structure that is capable of being changed from a relatively non-conductive state to a relatively conductive state by the application of a stimulus; and
(b) placing a second conductive component in electrical contact with said second ends of said substantially parallel molecular units.

60. A method of producing an electronic junction according to claim 59 wherein said second conductive component is chemically bound to said second ends of said substantially parallel molecular units.

61. A method of producing an electronic junction according to claim 59 wherein said second conductive component is covalently bound to said second ends of said substantially parallel molecular units.

62. An electronic junction comprising:
(a) a first conductive component, said first conductive component comprising:
(i) a substrate having a contact surface; and
(ii) a monolayer of plurality of substantially parallel molecular units having first and second ends, and attached through their first ends to said contact surface through a conjugated bond, wherein said substantially parallel molecular units comprise a chemical structure capable of being changed from a relatively non-conductive state to a relatively conductive state by the application of a stimulus; and
(b) a second conductive component in electrical contact with said second ends of said substantially parallel molecular units, said second conductive component comprising a metal.

63. An electronic junction according to claim 62 wherein said metal comprised by said second conductive component is selected from the group consisting of mercury, silver, and copper.

64. An electronic junction according to claim 62 wherein said metal comprised by said second conductive component is deposited upon said monolayer of substantially parallel molecular units by a method selected from the group consisting of chemical vapor deposition, thermal vapor deposition, sputtering, electrochemical deposition and solution chemical reactions.

65. An electronic junction according to claim 62 wherein said first conductive component comprises electrically conductive carbon.

66. An electronic junction according to claim 62 wherein said substantially parallel molecular units are of substantially the same length.

67. An electronic junction according to claim 62 wherein second conductive component is chemically bound to said second ends of said substantially parallel molecular units.

68. An electronic junction according to claim 62 wherein at least some of said molecular units comprise a moiety capable of binding at least one chemical species so as to alter the electronic character of said at least some of said molecular units.

69. An electronic junction according to claim 62 wherein at least some of said molecular units comprise a moiety capable of binding a chemical entity selected from the group consisting of metal ions, organic molecules, and biological materials, so as to alter the electronic character of said at least some of said molecular units.

70. An electronic junction according to claim 62 wherein at least some of said molecular units are sensitive to incident electromagnetic radiation which may alter the electronic character of said at least some of said molecular units.

71. An electronic junction according to claim 70 wherein at least one of said first and second conductive components is translucent.

72. An electronic junction according to claim 62 wherein at least some of said molecular units form a molecular orbital such that the passage of current through at least some of said molecular units causes the emission of electromagnetic radiation from said at least some of said molecular units.

73. An electronic junction according to claim 72 wherein said electromagnetic radiation is visible light.

74. An electronic junction according to claim 72 wherein said electromagnetic radiation is infrared light.

75. An electronic junction according to claim 72 wherein said electromagnetic radiation is amplified.

76. An electronic junction according to claim 62 wherein at least one of said first and second conductive components is translucent.

77. An electronic junction according to claim 62 wherein at least some of said molecular units are sensitive to the passage of current such that the passage of current through at least some of said molecular units causes a change in the reflectivity or transmissibility of said monolayer.

78. An electronic junction according to claim 62 wherein at least some of said molecular units are sensitive to the incidence of electromagnetic radiation such that the incidence of electromagnetic radiation on at least some of said molecular units causes a change in the reflectivity or transmissibility of said monolayer.

79. An electronic junction according to claim 62 wherein at least some of said molecular units form an arrangement of molecular orbitals such that said electronic junction is capable of functioning as a semiconductor.

80. A method of producing an electronic junction, said method comprising:
  (a) providing a first conductive component, said first conductive component comprising:
    (i) a substrate having a contact surface; and
    (ii) a monolayer of plurality of substantially parallel molecular units having first and second ends, and attached through their first ends to said contact surface through a conjugated bond, wherein said substantially parallel molecular units comprise a chemical structure capable of being changed from a relatively non-conductive state to a relatively conductive state by the application of a stimulus; and
  (b) placing a second conductive component in electrical contact with said second ends of said substantially parallel molecular units, said second conductive component comprising at least one metal.

81. A method of producing an electronic junction according to claim 80 wherein said metal comprised by said second conductive component is deposited upon said monolayer of substantially parallel molecular units by a method selected from the group consisting of chemical vapor deposition, thermal vapor deposition, sputtering, electrochemical deposition and solution chemical reactions.

82. A method of producing an electronic junction according to claim 80 wherein said second conductive component is chemically bound to said second ends of said substantially parallel molecular units.

83. A method of producing an electronic junction according to claim 80 wherein said second conductive component is covalently bound to said second ends of said substantially parallel molecular units.

84. An electronic junction comprising:
  (a) a first conductive component, said first conductive component comprising:
    (i) a substrate having a contact surface, said substrate comprising a material selected from the group consisting of metals and semi-conductive materials; and
    (ii) a monolayer of plurality of substantially parallel molecular units having first and second ends, and attached through their first ends to said contact surface through a chemical bond having the formula:

R—X wherein R is a metal, silicon, or carbon atom of said substrate and X is an oxygen or carbon atom of said substantially parallel molecular unit; and
  (b) a second conductive component in electrical contact with said second ends of said substantially parallel molecular units, said second conductive component comprising a metal.

85. An electronic junction according to claim 84 wherein said substrate comprises a metal selected from the group consisting of mercury, silver, and copper.

86. An electronic junction according to claim 84 wherein said substrate comprises a semiconductive material selected from the group consisting of indium-doped-tin-oxide and silicon.

87. An electronic junction according to claim 84 wherein said substantially parallel molecular units that are of substantially the same length.

88. An electronic junction according to claim 84 wherein second conductive component is chemically bound to said second ends of said substantially parallel molecular units.

89. An electronic junction according to claim 84 wherein at least some of said molecular units comprise a moiety capable of binding at least one chemical species so as to alter the electronic character of said at least some of said molecular units.

90. An electronic junction according to claim 84 wherein at least some of said molecular units comprise a moiety capable of binding a chemical entity selected from the group consisting of metal ions, organic molecules, and biological materials, so as to alter the electronic character of said at least some of said molecular units.

91. An electronic junction according to claim 84 wherein at least some of said molecular units are sensitive to incident electromagnetic radiation which may alter the electronic character of said at least some of said molecular units.

92. An electronic junction according to claim 91 wherein at least one of said first and second conductive components is translucent.

93. An electronic junction according to claim 84 wherein at least some of said molecular units form a molecular orbital such that the passage of current through at least some of said molecular units causes the emission of electromagnetic radiation from said at least some of said molecular units.

94. An electronic junction according to claim 93 wherein said electromagnetic radiation is visible light.

95. An electronic junction according to claim 93 wherein said electromagnetic radiation is infrared light.

96. An electronic junction according to claim 93 wherein said electromagnetic radiation is amplified.

97. An electronic junction according to claim 93 wherein at least one of said first and second conductive components is translucent.

98. An electronic junction according to claim 84 wherein at least some of said molecular units are sensitive to the passage of current such that the passage of current through at least some of said molecular units causes a change in the reflectivity or transmissibility of said monolayer.

99. An electronic junction according to claim 84 wherein at least some of said molecular units are sensitive to the incidence of electromagnetic radiation such that the incidence of electromagnetic radiation on at least some of said molecular units causes a change in the reflectivity or transmissibility of said monolayer.

100. An electronic junction according to claim 84 wherein at least some of said molecular units form an arrangement of molecular orbitals such that said electronic junction is capable of functioning as a semiconductor.

101. A method of producing an electronic junction, said method comprising:
  (a) providing a first conductive component, said first conductive component comprising:
    (i) a substrate having a contact surface said substrate comprising a material selected from the group consisting of metals and semi-conductive materials; and
    (ii) a monolayer of plurality of substantially parallel molecular units having first and second ends, and attached through their first ends to said contact surface through a chemical bond having the formula:

R—X wherein R is a metal, silicon, or carbon atom of said substrate and X is an oxygen or carbon atom of said substantially parallel molecular unit; and
  (b) placing a second conductive component in electrical contact with said second ends of said substantially parallel molecular units.

102. A method of producing an electronic junction according to claim 101 wherein said substrate comprises a metal selected from the group consisting of mercury, silver, and copper.

103. A method of producing an electronic junction according to claim 101 wherein said substrate comprises a semi-conductive material comprising indium-doped-tin-oxide.

104. An electronic junction comprising:
  (a) a first conductive component, said first conductive component comprising:
    (i) a substrate having a contact surface; and
    (ii) a monolayer of plurality of substantially parallel molecular units having first and second ends, and attached through their first ends to said contact surface through a conjugated bond, wherein at least some of said molecular units are sensitive to the passage of current such that the passage of current through at least some of said molecular units causes a change in the reflectivity or transmissibility of said monolayer; and
  (b) a second conductive component in electrical contact with said second ends of said substantially parallel molecular units, said second conductive component comprising a metal.

105. An electronic junction according to claim 104 wherein said metal comprised by said second conductive component is selected from the group consisting of mercury, silver, and copper.

106. An electronic junction according to claim 104 wherein said metal comprised by said second conductive component is deposited upon said monolayer of substantially parallel molecular units by a method selected from the group consisting of chemical vapor deposition, thermal vapor deposition, sputtering, electrochemical deposition and solution chemical reactions.

107. An electronic junction according to claim 104 wherein said first conductive component comprises electrically conductive carbon.

108. An electronic junction according to claim 104 wherein said substantially parallel molecular units are of substantially the same length.

109. An electronic junction according to claim 104 wherein second conductive component is chemically bound to said second ends of said substantially parallel molecular units.

110. An electronic junction according to claim 104 wherein at least some of said molecular units comprise a moiety capable of binding at least one chemical species so as to alter the electronic character of said at least some of said molecular units.

111. An electronic junction according to claim 104 wherein at least some of said molecular units comprise a moiety capable of binding a chemical entity selected from the group consisting of metal ions, organic molecules, and biological materials, so as to alter the electronic character of said at least some of said molecular units.

112. An electronic junction according to claim 104 wherein at least some of said molecular units are sensitive to incident electromagnetic radiation which may alter the electronic character of said at least some of said molecular units.

113. An electronic junction according to claim 112 wherein at least one of said first and second conductive components is translucent.

114. An electronic junction according to claim 104 wherein at least some of said molecular units form a molecular orbital such that the passage of current through at least some of said molecular units causes the emission of electromagnetic radiation from said at least some of said molecular units.

115. An electronic junction according to claim 114 wherein said electromagnetic radiation is visible light.

116. An electronic junction according to claim 114 wherein said electromagnetic radiation is infrared light.

117. An electronic junction according to claim 114 wherein said electromagnetic radiation is amplified.

118. An electronic junction according to claim 104 wherein at least one of said first and second conductive components is translucent.

119. An electronic junction according to claim 104 wherein at least some of said molecular units are sensitive to the incidence of electromagnetic radiation such that the incidence of electromagnetic radiation on at least some of said molecular units causes a change in the reflectivity or transmissibility of said monolayer.

120. An electronic junction according to claim 104 wherein at least some of said molecular units form an arrangement of molecular orbitals such that said electronic junction is capable of functioning as a semiconductor.

\* \* \* \* \*

UNITED STATES PATENT AND TRADEMARK OFFICE
CERTIFICATE OF CORRECTION

PATENT NO.    : 6,855,950 B2
DATED         : February 15, 2005
INVENTOR(S)   : McCreery It is certified that error appears in the above-identified patent and that said Letters Patent is hereby corrected as shown below:

Title page,
Item [56], References Cited, OTHER PUBLICATIONS, please delete "C. Zhou, M.R. Deshpande, M.A. Reed, L. Jones, J.M. Tour, *"Nanoscale Metal/Self-Assembled Monolayer/Metal Heterostructures"* Appl. Phys. Lett., 1997, 71(5), 661." and insert -- C. Zhou, M.R. Deshpande, M.A. Reed, L. Jones, J.M. Tour, *"Nanoscale Metal/Self-Assembled Monolayer/Metal lHeterostructures"*, Appl. Phys. Lett., 1997, 71(5), 661. --.
OTHER PUBLICATIONS, please delete "S. Ranganathan, R. McCreery, S.M. Majji, M. Madou, "Photoresist-Derived Carbon for Microelectrochemical Applications", *J. Electrochem. Soc.*, 2000. 117, 277-282." and insert -- S. Ranganathan, R. McCreery, S.M. Majji, M. Madou, "Photoresist-Derived Carbon for Microelectrochemical Applications", *J. Electrochem. Soc.*, 2000. 147,277 -282. --.
OTHER PUBLICATIONS, please delete "W. Tian, S. Datta, S. Hong, R. Reifenberger, J.I. Henderson, C.P. Kubiak, *"Conductance Spectra of Molecular Wires"*. J. Chem. Physics, 1998, 109(7), 2874-2882." and insert --W. Tian, S. Datta, S. Hong, R. Reifenberger, J.I. Henderson, C.P. Kubiak, *"Conductance Spectra of Molecular Wires"*, J. Chem. Physics, 1998, 109(7), 2874-2882. --.
OTHER PUBLICATIONS, please delete "D.F. Padowitz, R.J. Hamers, *"Voltage-Dependent STM of Covalently Bound Molecules on Si (100)"*, J. Phys. Chem., 1998, 102, 8541-8545." and insert -- D.F. Padowitz, R.J. Hamers, *"Voltage-Dependent STM of Covalently Bound Molecules on Si(100)"*, J. Phys. Chem., 1998, 102, 8541-8545. --

Column 17,
Line 51, please delete "R-X" and insert -- R----X --

Column 18,
Line 52, please delete "R-X" and insert -- R ----X --.

Column 19,
Line 57, please delete "R-X" and insert -- R----X --.

UNITED STATES PATENT AND TRADEMARK OFFICE
CERTIFICATE OF CORRECTION

PATENT NO.    : 6,855,950 B2
DATED         : February 15, 2005
INVENTOR(S)   : McCreery It is certified that error appears in the above-identified patent and that said Letters Patent is hereby corrected as shown below:

Column 24,
Line 9, please delete "R-X" and insert -- R---X --.

Column 25,
Line 23, please delete "R-X" and insert -- R---X --.

Signed and Sealed this

Thirty-first Day of May, 2005

JON W. DUDAS
*Director of the United States Patent and Trademark Office*

UNITED STATES PATENT AND TRADEMARK OFFICE
CERTIFICATE OF CORRECTION

PATENT NO.      : 6,855,950 B2
DATED           : February 15, 2005
INVENTOR(S)     : McCreery It is certified that error appears in the above-identified patent and that said Letters Patent is hereby corrected as shown below:

Title page,
Item [56], References Cited, OTHER PUBLICATIONS, please delete "C. Joachim, J.K. Gimzewski, R.R. Schlittler, C. Chavy, "*Electronic Transparence of a Single C60Molecule*", Phys. Rev. Let., 74(11), 2102-2105." and insert -- C. Joachim, J.K. Gimzewski, R.R. Schlittler, C. Chavy, "*Electronic Transparence of a Single C60 Molecule*", Phys. Rev. Let., 74(11), 2102-2105. --.
Please delete "J. L. Brédas, D. Beljonne, J. Cornil, J. Ph. Calbert, Z. Shuai, R. Slibey, "Electronic Structure of π-Conjugated Oligomers and Polymers: A Quantum-Chemical Approach to Transport Properties", *Synthetic Metals* 125 (2002) 107-116." and insert -- J. L. Brédas, D. Beljonne, J. Cornil, J. Ph. Calbert, Z. Shuai, R. Silbey, "Electronic Structure of π-Conjugated Oligomers and Polymers: A Quantum-Chemical Approach to Transport Properties", *Synthetic Metals* 125 (2002) 107-116. --
Please delete "Benoît Champagne, Eric A. Perpúte, "Bond Length Alternation Effects on the Static Electronic Polarizability and Second Hyperpolarizability of Polyacetylene Chains", *International Journal of Quantum Chemistry*, vol. 75, 441-447 (1999)." and insert -- Benoît Champagne, Eric A. Perpète, "Bond Length Alternation Effects on the Static Electronic Polarizability and Second Hyperpolarizability of Polyacetylene Chains", *International Journal of Quantum Chemistry*, Vol. 75, 441-447 (1999). --

Column 13,
Line 31, please delete "4-(phenylmethylene)phenyl" and insert -- 4-(phenyl methylene) phenyl --.

Column 15,
Line 11, please delete "semiconductors" and insert -- semi-conductors --.

UNITED STATES PATENT AND TRADEMARK OFFICE
CERTIFICATE OF CORRECTION

PATENT NO. : 6,855,950 B2
DATED : February 15, 2005
INVENTOR(S) : McCreery

It is certified that error appears in the above-identified patent and that said Letters Patent is hereby corrected as shown below:

Column 16,
Line 52, please delete "RoomTemperature" and insert -- Room-Tempurature --.

Signed and Sealed this

Ninth Day of August, 2005

JON W. DUDAS
*Director of the United States Patent and Trademark Office*

UNITED STATES PATENT AND TRADEMARK OFFICE
CERTIFICATE OF CORRECTION

PATENT NO. : 6,855,950 B2
DATED : February 15, 2005
INVENTOR(S) : McCreery

It is certified that error appears in the above-identified patent and that said Letters Patent is hereby corrected as shown below:

Title page,
Item [56], References Cited, OTHER PUBLICATIONS, please delete "C. Zhou, M.R. Deshpande, M.A. Reed, L. Jones, J.M. Tour, *"Nanoscale Metal/Self-Assembled Monolayer/Metal Heterostructures"*Appl. Phys. Lett., 1997, 71(5), 661." and insert -- C. Zhou, M.R. Deshpande, M.A. Reed, L. Jones, J.M. Tour, *"Nanoscale Metal/Self-Assembled Monolayer/Metal Heterostructures"*, Appl. Phys. Lett., 1997, 71(5), 661. --.
OTHER PUBLICATIONS, please delete "S. Ranganathan, R. McCreery, S.M. Majji, M. Madou, "Photoresist-Derived Carbon for Microelectrochemical Applicaions", *J. Electrochem. Soc.*, 2000. 117, 277-282." and insert -- S. Ranganathan, R. McCreery, S.M. Majji, M. Madou, "Photoresist-Derived Carbon for Microelectrochemical Applications", *J. Electrochem. Soc.*, 2000. 147,277 -282. --.
OTHER PUBLICATIONS, please delete "W. Tian, S. Datta, S. Hong, R. Reifenberger, J.I. Henderson, C.P. Kubiak, *"Conductance Spectra of Molecular Wires"*. J. Chem. Physics, 1998, 109(7), 2874-2882." and insert --W. Tian, S. Datta, S. Hong, R. Reifenberger, J.I. Henderson, C.P. Kubiak, *"Conductance Spectra of Molecular Wires"*, J. Chem. Physics, 1998, 109(7), 2874-2882. --.
OTHER PUBLICATIONS, please delete "D.F. Padowitz, R.J. Hamers, *"Voltage-Dependent STM of Covalently Bound Molecules on Si (100)"*, J. Phys. Chem., 1998, 102, 8541-8545." and insert -- D.F. Padowitz, R.J. Hamers, *"Voltage-Dependent STM of Covalently Bound Molecules on Si(100)"*, J. Phys. Chem., 1998, 102, 8541-8545. --

Column 17,
Line 51, please delete "R-X" and insert -- R----X --.

Column 18,
Line 52, please delete "R-X" and insert -- R ----X --.

Column 19,
Line 57, please delete "R-X" and insert -- R----X --.

UNITED STATES PATENT AND TRADEMARK OFFICE
CERTIFICATE OF CORRECTION

PATENT NO. : 6,855,950 B2
DATED : February 15, 2005
INVENTOR(S) : McCreery

It is certified that error appears in the above-identified patent and that said Letters Patent is hereby corrected as shown below:

<u>Column 24,</u>
Line 9, please delete "R-X" and insert -- R---X --.

<u>Column 25,</u>
Line 23, please delete "R-X" and insert -- R---X --.

This certificate supersedes Certificate of Correction issued May 31, 2005.

Signed and Sealed this

Eighteenth Day of October, 2005

JON W. DUDAS
*Director of the United States Patent and Trademark Office*